US010333558B2

(12) United States Patent
Kifune et al.

(10) Patent No.: US 10,333,558 B2
(45) Date of Patent: Jun. 25, 2019

(54) DECODING DEVICE AND DECODING METHOD

(71) Applicant: Toshiba Memory Corporation, Minato-ku (JP)

(72) Inventors: Naoko Kifune, Yokohama (JP); Hironori Uchikawa, Fujisawa (JP); Daiki Watanabe, Yokohama (JP)

(73) Assignee: Toshiba Memory Corporation, Minato-ku (JP)

( * ) Notice: Subject to any disclaimer, the term of this patent is extended or adjusted under 35 U.S.C. 154(b) by 75 days.

(21) Appl. No.: 15/702,204

(22) Filed: Sep. 12, 2017

(65) Prior Publication Data

US 2018/0278273 A1 Sep. 27, 2018

(30) Foreign Application Priority Data

Mar. 24, 2017 (JP) ................................ 2017-059738

(51) Int. Cl.
*H03M 13/29* (2006.01)
*H03M 13/07* (2006.01)
(Continued)

(52) U.S. Cl.
CPC ..... *H03M 13/2927* (2013.01); *G06F 11/1012* (2013.01); *G06F 11/1068* (2013.01);
(Continued)

(58) Field of Classification Search
CPC ............. H03M 13/2927; H03M 13/07; H03M 13/1108; G06F 11/1012; G06F 11/1068; G11C 29/52; G11C 2029/0409; G11C 2029/0411
USPC ............... 714/758, 752, 755, 763, 764, 766, 714/768–771, 773, 799; 365/185.09, 200, 365/201
See application file for complete search history.

(56) References Cited

U.S. PATENT DOCUMENTS 4,564,945 A * 1/1986 Glover .................. G11B 7/013 360/48
5,991,911 A * 11/1999 Zook ................. G11B 20/1833 714/755
(Continued)

FOREIGN PATENT DOCUMENTS

JP 2009-225325 10/2009
WO WO 2006/132331 A1 12/2006

*Primary Examiner* — John J Tabone, Jr.
(74) *Attorney, Agent, or Firm* — Oblon, McClelland, Maier & Neustadt, L.L.P.

(57) ABSTRACT

According to one embodiment, a decoding device that decodes a multi-dimensional error correction code having two or more component codes includes a storage unit that stores therein the multi-dimensional error correction code, an additional-information storage unit that manages each syndrome of the at least two component codes or a reliability flag indicating whether the syndrome has a value of 0 or other than 0, a decoder that performs a first decoding process in a unit of component code with respect to the multi-dimensional error correction code stored in the storage unit to detect an error vector of each component code, and a detection unit that determines whether detection of the error vector by the decoder is false detection, based on the syndrome or the reliability flag stored in the additional-information storage unit.

20 Claims, 13 Drawing Sheets

(51) Int. Cl.

| | |
|---|---|
| ***G11C 29/52*** | (2006.01) |
| ***G06F 11/10*** | (2006.01) |
| ***H03M 13/11*** | (2006.01) |
| *G11C 29/04* | (2006.01) |

(52) U.S. Cl.

CPC ............. *G11C 29/52* (2013.01); *H03M 13/07* (2013.01); *H03M 13/1108* (2013.01); *G11C 2029/0409* (2013.01); *G11C 2029/0411* (2013.01)

(56) References Cited

U.S. PATENT DOCUMENTS 5,996,105 A * 11/1999 Zook ..................... H03M 13/29 714/755
6,048,090 A * 4/2000 Zook .................. G11B 20/1833 714/755
6,052,815 A * 4/2000 Zook .................. G11B 20/1833 714/758
8,108,752 B2 1/2012 Tanaka
8,359,518 B2 * 1/2013 Rumbolt ........... H03M 13/2909 714/755
8,888,003 B2 * 11/2014 Deppieri .................. G06K 7/14 235/437
2002/0116681 A1 * 8/2002 Amrani ................. H03M 13/29 714/792
2006/0156171 A1 * 7/2006 Kuznetsov ......... G11B 20/1866 714/755
2011/0099452 A1 * 4/2011 Rumbolt ........... H03M 13/2909 714/755
2013/0256410 A1 * 10/2013 Deppieri .................. G06K 7/14 235/437
2015/0333774 A1 11/2015 Kaynak et al.
2016/0072529 A1 * 3/2016 Suzuki .............. H03M 13/2909 714/755
2017/0187395 A1 * 6/2017 Watanabe ......... H03M 13/2909

* cited by examiner

DECODING DEVICE AND DECODING METHOD

CROSS-REFERENCE TO RELATED APPLICATIONS

This application is based upon and claims the benefit of priority from Japanese Patent Application No. 2017-059738, filed on Mar. 24, 2017; the entire contents of all of which are incorporated herein by reference.

FIELD

Embodiments described herein relate generally to a decoding device and a decoding method.

BACKGROUND

In a memory device, in general, in order to protect data to be stored, encoded data is stored. Therefore, when the data stored in the memory device is to be read, decoding with respect to the error-correction coded data is performed.

DETAILED DESCRIPTION

Exemplary embodiments of a decoding device, a memory controller including the decoding device, a memory system, and a control method of a memory controller will be explained below in detail with reference to the accompanying drawings. The present invention is not limited to the following embodiments.

A bit error or a symbol error (hereinafter, simply "error") may be included in data read from a recording medium. Therefore, error correction is performed with respect to the read data to detect and correct such an error. However, if false detection in which an error is erroneously detected at the time of error correction occurs and data is corrected based on the false detection, an error based on the false detection is included in the data in addition to the error at the time of read. In the present descriptions, rewrite of an internal memory by error correction based on false detection is referred to as "false correction". If such false correction occurs, there is a possibility that error correction cannot be performed with respect to the data read from the recording medium. In this case, correct data cannot be acquired from the recording medium.

In the embodiments exemplified below, in iterative decoding that repeats decoding with respect to an error correction code (hereinafter, "multi-dimensional error correction code") in which user data is protected more than double by a plurality of error correction codes (hereinafter, "component code"), degradation of error correction performance can be suppressed by appropriately detecting and handling the false detection and the false correction.

First Embodiment

Figure 1:
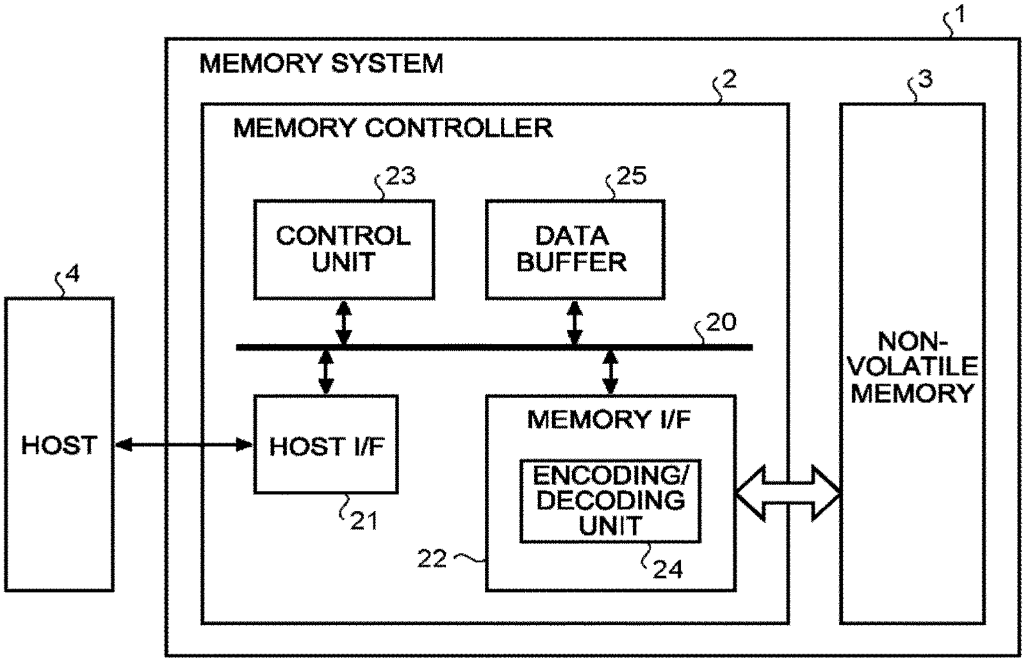
FIG. 1 is a block diagram illustrating a schematic configuration example of a memory system (memory device) according to a first embodiment.

FIG. 1 is a block diagram illustrating a schematic configuration example of a memory system (memory device) according to a first embodiment. As illustrated in FIG. 1, a memory system 1 includes a memory controller 2 and a non-volatile memory 3. The memory system 1 can be connected to a host 4. FIG. 1 illustrates a state in which the memory system 1 is connected to the host 4. The host 4 can be an electronic device such as a personal computer or a mobile terminal.

The non-volatile memory 3 is a non-volatile memory that stores therein data in a non-volatile manner and is, for example, a NAND flash memory (hereinafter, simply "NAND memory"). In the following descriptions, a case in which a NAND memory is used as the non-volatile memory 3 is exemplified. However, a semiconductor memory other than a NAND memory, such as a three-dimensional structure flash memory, an ReRAM (Resistance Random Access Memory), and an FeRAM (Ferroelectric Random Access Memory) can be used as the non-volatile memory 3. It is not essential that the non-volatile memory 3 is a semiconductor memory, and the present embodiment is also applicable to various types memory media other than a semiconductor memory.

The memory system 1 can be a memory card or the like in which the memory controller 2 and the non-volatile memory 3 are configured as one package, or can be an SSD (Solid State Drive) or the like.

The memory controller 2 controls write to the non-volatile memory 3 according to a write command (request) from the host 4. The memory controller 2 controls read from the non-volatile memory 3 according to a read command from the host 4. The memory controller 2 includes a host I/F (host interface) 21, a memory I/F (memory interface) 22, a control unit 23, and a data buffer 25. The host I/F 21, the memory I/F 22, the control unit 23, and the data buffer 25 are connected to each other by an internal bus 20.

The host I/F 21 performs processing according to an interface standard between the host 4 and the memory controller 2, and outputs a command, user data, and the like received from the host 4 to the internal bus 20. The host I/F 21 transmits user data read from the non-volatile memory 3, a response from the control unit 23, and the like to the host 4.

The memory I/F 22 performs a writing process to the non-volatile memory based on an instruction from the control unit 23. The memory I/F 22 performs a reading process from the non-volatile memory 3 based on an instruction from the control unit 23.

The control unit 23 integrally controls respective constituent elements of the memory system 1. When having received a command from the host 4 via the host I/F 21, the control unit 23 executes control according to the command. For example, the control unit 23 instructs the memory I/F 22 to write data to the non-volatile memory 3 according to a command from the host 4. The control unit 23 also instructs the memory I/F 22 to read data from the non-volatile memory 3 according to a command from the host 4.

Upon reception of a write request from the host 4, the control unit 23 decides a storage region (a memory region) on the non-volatile memory 3 with respect to user data accumulated in the data buffer 25. That is, the control unit 23 manages a write destination of the user data in the non-volatile memory 3. Correspondence between a logical address of the user data received from the host 4 and a physical address indicating the storage region on the non-volatile memory 3 where the user data is stored is stored as an address conversion table.

Further, upon reception of a read request from the host 4, the control unit 23 converts a logical address specified by the read request to a physical address by using the address conversion table described above, and instructs the memory I/F 22 to perform read from the physical address.

In the non-volatile memory 3 such as a NAND memory, generally, write and read are performed in a unit of data referred to as "page", and deletion is performed in a unit of data referred to as "block". In the present embodiment, a plurality of memory cells connected to the same word line are referred to as "memory cell group". When the memory cell is a single level cell (SLC), one memory cell group corresponds to one page. When the memory cell is a multi-level cell (MLC), one memory cell group corresponds to a plurality of pages. The respective memory cells are connected to a word line and are also connected to a bit line. Accordingly, the respective memory cells can be identified by an address identifying the word line and an address identifying the bit line.

The data buffer 25 temporarily stores therein user data received from the host 4 by the memory controller 2 until the user data is stored in the non-volatile memory 3. The data buffer 25 also temporarily stores therein the user data read from the non-volatile memory 3 until the user data is transmitted to the host 4. A general-purpose memory such as an SRAM (Static Random Access Memory) and a DRAM (Dynamic Random Access Memory) can be used for the data buffer 25.

An encoding/decoding unit (decoding device) 24 is provided in the memory I/F 22. The encoding/decoding unit 24 encodes user data to be written in the non-volatile memory 3 to generate a code word. The encoding/decoding unit 24 decodes a reception word read from the non-volatile memory 3 to restore the user data. The data encoded by the encoding/decoding unit 24 can include control data and the like to be used in the memory controller 2 other than the user data. In the following descriptions, these pieces of data are collectively referred to as "user data". A part or all of the encoding/decoding unit 24 can be provided not only in the memory I/F 22 but also outside of the memory I/F 22 and connected to the internal bus 20.

Figure 2:
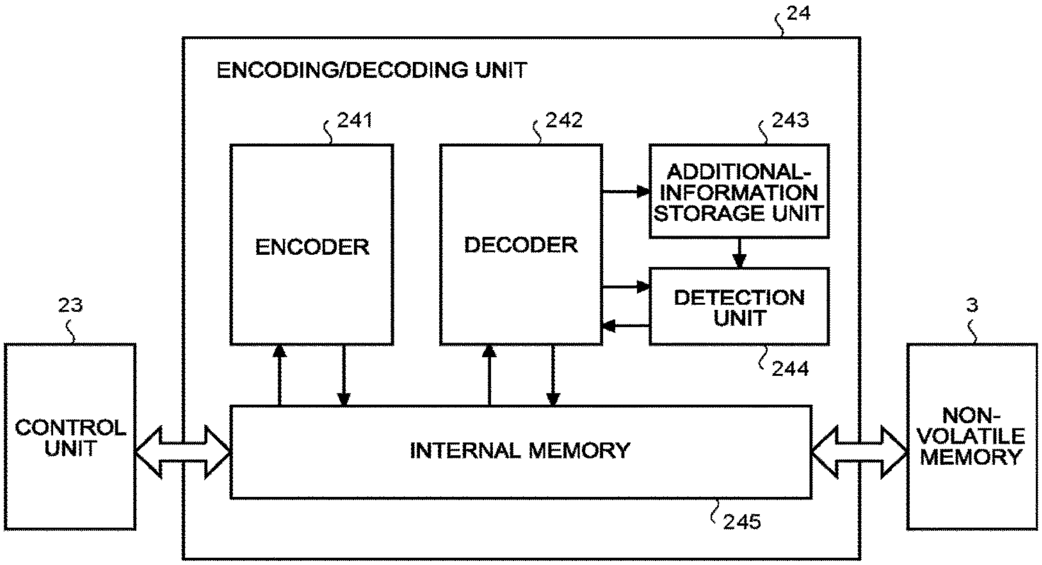
FIG. 2 is a block diagram illustrating a detailed block configuration example of an encoding/decoding unit illustrated in FIG. 1.

FIG. 2 illustrates a more detailed block configuration example of the encoding/decoding unit 24 illustrated in FIG. 1. As illustrated in FIG. 2, the encoding/decoding unit 24 includes an encoder 241, a decoder 242, an additional-information storage unit 243, a detection unit 244, and an internal memory 245.

The internal memory 245 is a memory region configured by, for example, an SRAM. The internal memory 245 functions as a working memory at the time of encoding user data instructed from the control unit 23 to be written in the non-volatile memory 3. The internal memory 245 also functions as a working memory at the time of decoding a reception word read from the non-volatile memory 3 to restore the user data.

At the time of writing data in the non-volatile memory 3, the control unit 23 instructs the memory I/F 22 to encode user data accumulated in the data buffer 25. At this time, the control unit 23 decides a storage place (a storage address) of a code word in the non-volatile memory 3, and also instructs the memory I/F 22 to write the code word to the decided storage place. The encoder 241 encodes user data transferred from the data buffer 25 to the internal memory 245 to generate a code word based on the instruction from the control unit 23 input to the memory I/F 22, and stores the generated code word in the instructed storage region.

As an encoding method to be employed for the encoder 241, for example, an encoding method using a BCH (Bose-Chandhuri-Hocquenghem) code or an RS (Reed-Solomon) code can be exemplified. In the present embodiment, the encoder 241 generates a multi-dimensional error correction code from user data as a code word. The multi-dimensional error correction code is an error correction code that protects at least a part of user data more than double by a two-dimensional component code of, for example, a component code in a column direction and a component code in a row direction, and a two-dimensional or more dimensional component code represented by an iterated code that protects user data doubly. Such a multi-dimensional error correction code includes, other than the iterated code described above, graph codes that are a concept generalizing an iterated code, and generalized LDPC codes (Generalized Low-Density Parity Check Codes) that are a concept further generalizing graph codes. In the present descriptions, for example, arrangement directions of symbols configuring the respective component codes such as a row direction and a column direction in an iterated code are referred to as one "dimension", respectively. Further, in the following descriptions, an iterated code is exemplified as a multi-dimensional error correction code to simplify the descriptions.

Figure 3:
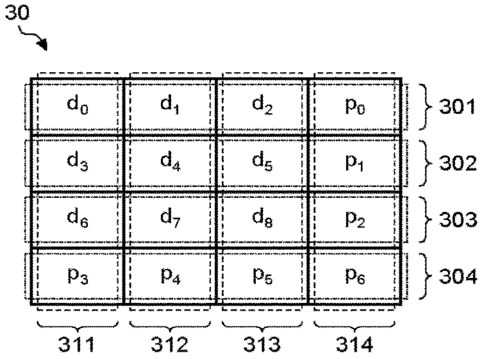
FIG. 3 is a diagram illustrating a schematic configuration example of a multi-dimensional error correction code (an iterated cod to be used as an example in the first embodiment.

FIG. 3 is a diagram illustrating a schematic configuration example of a multi-dimensional error correction code to be used as an example in the present embodiment. As an example of the multi-dimensional error correction code, an iterated code 30 that is a two-dimensional error correction code by an RS code in which a code length is 16 symbols and an information length (a data length of user data) is 4 symbols, is exemplified in FIG. 3. The iterated code 30 is configured by, for example, data symbols $d_0$ to $d_8$ and parity symbols $p_0$ to $p_6$. In the present embodiment, the iterated code 30 as a two-dimensional error correction code is exemplified as the multi-dimensional error correction code. However, the iterated code 30 is not limited thereto. That is, as described above, various error correction codes can be used so long as the error correction code is a two-dimensional or more dimensional (multi-dimensional) error correction code that protects at least a part of user data more than double by a two-dimensional or more dimensional component code.

In the iterated code 30 having a code structure as illustrated in FIG. 3, the data symbols $d_0$ to $d_8$ and the parity symbols $p_0$ to $p_6$ are respectively protected doubly by eight component codes 301 to 304 and 311 to 314. For example, in the component code 301, the data symbols $d_0$ to $d_2$ are encoded by the parity symbol $p_0$. Therefore, as the data symbol $d_0$ is focused upon, the data symbol $d_0$ is protected simultaneously and doubly by the component code 301 and the component code 311. Similarly, the respective symbols $d_1$ to $d_8$ other than the data symbol $d_0$ are protected doubly by the component codes 301 to 303 in the row direction and the component codes 311 to 313 in the column direction. In FIG. 3, the configuration is such that the parity symbols $p_0$ to $p_6$ are also protected doubly; however, single protection can be included according to the corresponding code configuration.

The symbol (data symbol and parity symbol) in the present description means a unit of information. For example, the symbol of binary BCH codes is a bit (binary information of "0" or "1"), and the symbol of RS codes is an element of a general finite field. Further, the code word of the error correction code is generally a vector on which symbols are arranged. Therefore, when the multi-dimensional error correction code is a BCH code, the code word of the component code (hereinafter, "component code word") has a code structure in which the binary bit information of "0" or "1" is arranged for a predetermined number of symbols. Meanwhile, when the multi-dimensional error correction code is an RS code, the component code word has a code structure in which elements of a Galois extension field are arranged for a predetermined number of symbols.

When data is to be read from the non-volatile memory 3, a read instruction from a storage place where an intended code word is stored is input from the control unit 23 to the memory I/F 22, along with an address specifying the storage place. The memory I/F 22 starts to read the code word from the specified address of the non-volatile memory 3 according to the instruction from the control unit 23, and instructs the decoder 242 in the memory I/F 22 to start a decoding process with respect to the read code word (reception word). Thereafter, when the code word to be decoded is read from the non-volatile memory 3 and accumulated in the internal memory 245, data in the internal memory 245 is input to the decoder 242 in a unit of component code word and decoded.

In the decoding process by the decoder 242, a position and a value of an error symbol included in the component code word to be decoded are detected. In the present description, a vector in which "1" is stored at the position of the error symbol detected by the decoding process and other elements are represented by 0, and the number of elements is same as a component code length is also referred to as "error vector". If an error vector is detected, the decoder 242 registers in the additional-information storage unit 243 a fact that the component code has succeeded in decoding, in other words, a syndrome is 0, with regard to the component code in which the error vector has been detected. Details of the additional information are described later.

When an error vector has been found by the decoding process performed by the decoder 242, the detection unit 244 determines whether the detected error vector is false detection, based on the additional information registered in the additional-information storage unit 243 (first false-detection prevention unit). If the detection unit 244 determines that the detection of the error vector is not false detection, the decoder 242 performs a rewriting process of rewriting the value of the corresponding symbol in the internal memory 245 to a value estimated to be correct. On the other hand, if the detection unit 244 determines that the detection of the error vector is false detection, the decoder 242 does not perform the rewriting process.

The decoding process to be performed by the decoder 242 can include hard decision decoding and soft decision decoding. The hard decision decoding is a decoding process in which decoding is performed upon input of a hard decision value to output a hard decision value as a result thereof. Meanwhile, the soft decision decoding is a decoding process in which decoding is performed upon input of a soft decision value to output a soft decision value as a result thereof.

Generally, soft decision decoding has characteristics such hat the error correction capability is higher than that of hard decision decoding but the processing time thereof is long. Therefore, for example, the decoder 242 can be configured to perform the hard decision decoding first with respect to the reception word read from the non-volatile memory 3 as a hard decision value and stored in the internal memory 245, read the reception word that has not been decoded by the hard decision decoding as a soft decision value and store the soft decision value in the internal memory 245, and then perform the soft decision decoding with respect to the reception word having the soft decision value stored in the internal memory 245. Note that the configuration is not limited thereto and can be variously modified. For example, a configuration in which hard decision decoding is omitted and soft decision decoding is performed with respect to all the reception words can be employed.

Figure 4:
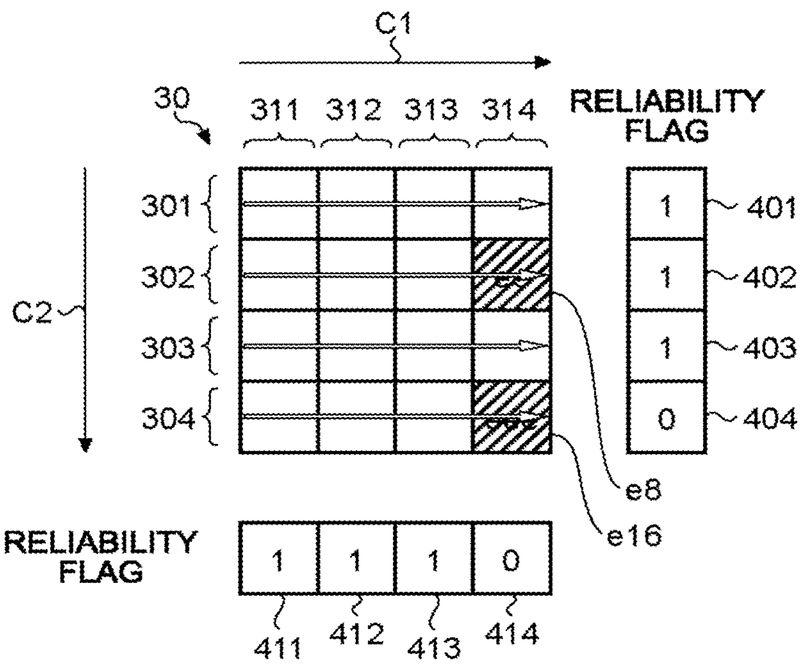
FIG. 4 is a schematic diagram illustrating an example of a flow of a decoding process with respect to component codes in a row direction according to the first embodiment.
Figure 5:
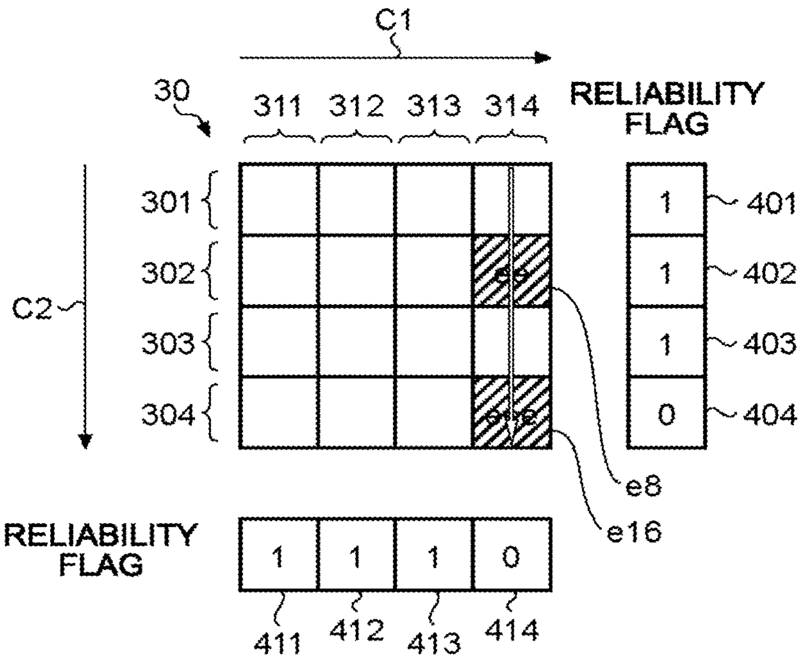
FIG. 5 is a schematic diagram illustrating an example of a flow of a decoding process with respect to component codes in a column direction according to the first embodiment.

Next, a flow of the decoding process according to the present embodiment is described in detail with reference to the drawings. FIGS. 4 and 5 are schematic diagrams for explaining a flow of the decoding process according to the present embodiment, where FIG. 4 illustrates an example of the flow of the decoding process with respect to component codes in the row direction, and FIG. 5 illustrates an example of the flow of the decoding process with respect to component codes in the column direction to be performed after the decoding process illustrated in FIG. 4. In the present description, it is assumed that the multi-dimensional error correction code to be decoded is the iterated code 30 illustrated in FIG. 3. However, in the present description, a case where the iterated code 30 illustrated in FIG. 3 is expanded to a two-dimensional BCH block iterated code including a code structure in which blocks including user data are $d_0$ to $d_8$ and blocks including the parity bit are $p_0$ to $p_6$, and a plurality of symbols are included in the respective blocks is illustrated. In FIG. 3, it is assumed that the row direction in the iterated code 30 is a C1 direction (or dimension), and the column direction is a C2 direction (or dimension). Further, in the following descriptions, a case where the maximum correctable number t of the decoder 242 is 2 symbols is exemplified.

As illustrated in FIGS. 4 and 5, in the present embodiment, reliability flags 401 to 404 and 411 to 414 are set as additional information to be added to the respective component codes constituting the iterated code 30. As a specific example, the reliability flag 401 is set to the component code 301 in the C1 direction. Further, the reliability flag 411 is set to the component code 311 in the C2 direction. As for the reliability flags 401 to 404 and 411 to 414, a binary flag indicating by "1" that the syndrome of the component code is 0 and indicating by "0" that the syndrome is other than 0, that is, the component code includes an error can be used. However, the reliability flag is not limited to the binary flag that indicates a possibility that the component code does not include an error (hereinafter, "reliability") by two stages, and information indicating the reliability by three or more stages can be used as additional information. Alternatively, the syndrome can be used as the additional information instead of the reliability flag. In this case, the syndrome is used instead of the reliability flag in the following descriptions.

In the decoding process according to the present embodiment, a syndrome check is performed first with respect to the respective component codes 301 to 304 and 311 to 314 of the iterated code 30 read from the non-volatile memory 3 and accumulated in the internal memory 245, and the reliability flags 401 to 404 and 411 to 414 given to the respective component codes 301 to 304 and 311 to 314 are updated based on the result of the syndrome check.

However, an operation of updating the reliability flags 401 to 404 and 411 to 414 first is not limited to a syndrome check of respective component codes, and it is also possible to employ a configuration such that decoding is performed by limiting the number of corrections to 1 (=t−1) symbol, and the reliability flags 401 to 404 and 411 to 414 are updated based on the result. Alternatively, it is possible to employ a configuration such that iterative decoding (limited iterative decoding) in which the number of correction is (t−1) is performed, and the reliability flags 401 to 404 and 411 to 414 are updated based on the result.

When the operation of updating the reliability flags first is not a syndrome check but decoding, various decoding methods can be applied to the decoding, so long as the decoding method has a relatively low probability of occurrence of false correction, such as the iterative decoding described above in which the number of corrections is limited to (t−1).

The iterative decoding is a decoding method in which the reliability of a communication path is calculated from the acquired reception word by using encoding information, and at the time of decoding, update of the reliability is repeated to increase the reliability, and it is determined whether a correct code word has been acquired based on the finally acquired reliability, and the iterative decoding is one of the decoding methods capable of improving the error characteristics considerably. However, in the present embodiment, the decoding method is not limited to the iterative decoding, and various decoding methods such as bounded distance decoding can be applied, so long as the probability of occurrence of false correction is relatively low.

After the reliability flag is first updated, in the decoding of the iterated code 30 accumulated in the internal memory 245, the decoder 242 performs iterative decoding with respect to the respective component codes 301 to 304 and 311 to 314, in which, for example, the maximum number of corrections is set as a maximum correctable number t (=2).

A process of decoding to be performed with respect to the iterated code 30 after the reliability flag is first updated is described more specifically. In the present embodiment, the component codes 301 to 304 in the C1 direction are first decoded sequentially. As the decoding order, various orders can be applied, such as a method of selecting a component code to be decoded along the C2 direction in order from the component code 301 as the top row.

As a result of decoding with respect to the component codes 301 to 304 in the C1 direction, if an error vector is not detected in the iterated code 30, decoding with respect to the component codes 311 to 314 in the C2 direction is performed. On the other hand, if an error vector is detected in the iterated code 30 by decoding with respect to the component odes 301 to 304, the reliability flag of the component code including the error symbol indicated by the error vector, among the component codes 311 to 314 in the C2 direction is confirmed. If all the reliability flags regarding the confirmed component codes in the C2 direction indicate "0", that is, if the syndromes of the confirmed component codes are all "other than 0", the value of the symbol corresponding to the error vector in the iterated code 30 in the internal memory 245 is rewritten to a value estimated to be correct (rewriting process), and the reliability flag of the component code in the C1 direction including the error symbol indicated by the error vector is updated based on the syndrome calculated from the rewritten component code. At this time, the reliability flag of the component code in the C2 direction including the error symbol indicated by the error vector can be updated based on the syndrome calculated from the rewritten component code. On the other hand, if a reliability flag having "1" is included in the reliability flags of the component codes in the C2 direction confirmed above, that is, if a syndrome of "0" is included in the syndromes of the confirmed component codes, it is determined that there is a high possibility that the detection of the error vector by decoding with respect to the component codes 301 to 304 in the C1 direction is false detection, and the rewriting process with respect to the internal memory 245 is not performed.

Subsequently, in the decoding with respect to the component codes 311 to 314 in the C2 direction, as in the decoding with respect to the component coded 301 to 304 in the C1 direction, the component codes 311 to 314 are sequentially decoded according to a predetermined decoding order. If an error vector is detected in the iterated code 30 by the decoding with respect to the component codes 311 to 314, the reliability flag of the component code including the error symbol indicated by the error vector, among the component codes 311 to 314 in the C2 direction is confirmed, as in the decoding flow with respect to the component codes 301 to 304 in the C1 direction. If all the reliability flags indicate "0", a rewriting process with respect to the internal memory 245 is performed, and the reliability flag of the component code in the C2 direction including the error symbol indicated by the error vector is updated. At this time, the reliability flag of the component code in the C1 direction including the error symbol indicated by the error vector can be updated based on the syndrome calculated from the rewritten component code. Further, if a reliability flag having "1" is included in the confirmed reliability flags of the component codes in the C1 direction, as in the decoding flow with respect to the component codes 301 to 304 in the C1 direction, it is determined that there is a high possibility that the detection of the error vector by the decoding is false detection, and the rewriting process with respect to the internal memory 245 is not performed. After decoding with respect to the component codes 311 to 314 in the C2 direction described above has been performed, it is determined whether an end condition (cancellation condition) of an iterative decoding process is satisfied. If the condition is satisfied, the decoding process is finished. If the condition is not satisfied, decoding with respect to the component codes 301 to 304 in the C1 direction can be performed again.

As described above, in the present embodiment, in order to determine whether the detection of the error vector is false detection, such an algorithm (hereinafter, "first algorithm") is employed that "when an error vector is detected as a result of decoding of component codes in a certain dimension, if a reliability flag having "1" is included in the reliability flags of component codes in another dimension including an error indicated by the error vector, it is determined that the detection of the error vector is false detection, and if all the reliability flags of the component codes in the other dimension including the error vector indicate "0", it is determined that the detection of the error vector is not false detection".

The decoding flow is described with a specific example illustrated in FIGS. 4 and 5. In the example illustrated in FIG. 4, as a result of decoding with respect to the component codes 301 to 304 in the C1 direction, it is detected that the parity symbols $p_1$ and $p_6$ in the component codes 302 and 304 (see FIG. 3) are respectively an error e8 and an error e16. In FIGS. 4 and 5, errors included in the respective blocks are indicated by "e".

Therefore, the reliability flag 414 of the component code 314 including the parity symbols $p_1$ and $p_6$ corresponding to the error e8 and the error e16 is confirmed according to the first algorithm. The value of the reliability flag 414 is "0". Therefore, normally, a rewriting process is performed to rewrite the value of the symbol (parity symbols $p_1$ and $p_6$) corresponding to the error vector in the iterated code 30 in the internal memory 245 to a value estimated to be correct, and the reliability flags 402 and 404 of the component codes 302 and 304 in the C1 direction including the errors e8 and e16 are updated based on the syndromes respectively calculated from the rewritten component codes 302 and 304. At this time, the reliability flag 414 of the component code 314 in the C2 direction including the errors e8 and e16 can be updated based on the syndrome calculated from the rewritten component code 314.

However, in the present description, the error vector is an uncorrectable error vector, in other words, an error vector including an error exceeding 2 symbols that is the maximum correctable number t. Therefore, in the present example, a rewriting process with respect to a symbol (the parity symbol $p_6$) corresponding to the error e16 in the iterated code 30 in the internal memory 245 is not performed.

Subsequently, in the decoding with respect to the component codes 311 to 314 in the C2 direction, as in the decoding with respect to the component codes 301 to 304 in the C1 direction, decoding in a unit of component code is performed along the C1 direction sequentially from the component code 311 as the top column. As a result, in the example illustrated in FIG. 5, for example, the parity symbol $p_1$ (see FIG. 3) in the component code 314 is newly detected as the error e8. Therefore, the error e8 and the error 16 are included in the error vector detected by the decoding with respect to the component codes 311 to 314 in the C2 direction.

Therefore, the reliability flag 402 of the component code 302 including the parity symbol $p_1$ corresponding to the error e8 and the reliability flag 404 of the component code 304 including the parity symbol $p_6$ corresponding to the error e16 of the component codes 301 to 304 in the C1 direction are confirmed according to the first algorithm. Although the reliability flag 404 is "0", as described above, because the error e16 is an uncorrectable error, the rewriting process with respect to the parity symbol $p_6$ corresponding to the error e16 is not performed.

Meanwhile, the value of the reliability flag 402 with respect to the component code 302 is "1". This means that, as a result of decoding with respect to the component codes 311 to 314 in the C2 direction, an error e8 has been detected in a region indicated by the reliability flag 402 that there is no error.

Therefore, in the present embodiment, it is assumed that the detection of the error vector including the error e8 is false detection according to the first algorithm, and decoding this time with respect to the component codes 311 to 314 in the C2 direction is finished without performing the rewriting process with respect to the internal memory 245. Thereafter, it is determined whether the end condition (cancellation condition) of the iterative decoding process is satisfied. If the condition is satisfied, the decoding process is finished, and if the condition is not satisfied, decoding with respect to the component codes 301 to 304 in the C1 direction is performed again.

The algorithm for determining whether detection of the error vector is false detection is not limited to the first algorithm described above, and can be variously modified. Various algorithms can be employed as the first algorithm, for example, an algorithm to determine "when the number of errors included in a detected error vector is the maximum correctable number t, detection of the error vector is false detection", and an algorithm to determine "regarding one component code, when it is required to update the value of the reliability flags of two or more component codes in a dimension different from the dimension of the component code from "1" to "0", detection of the error vector is false detection".

Figure 6:
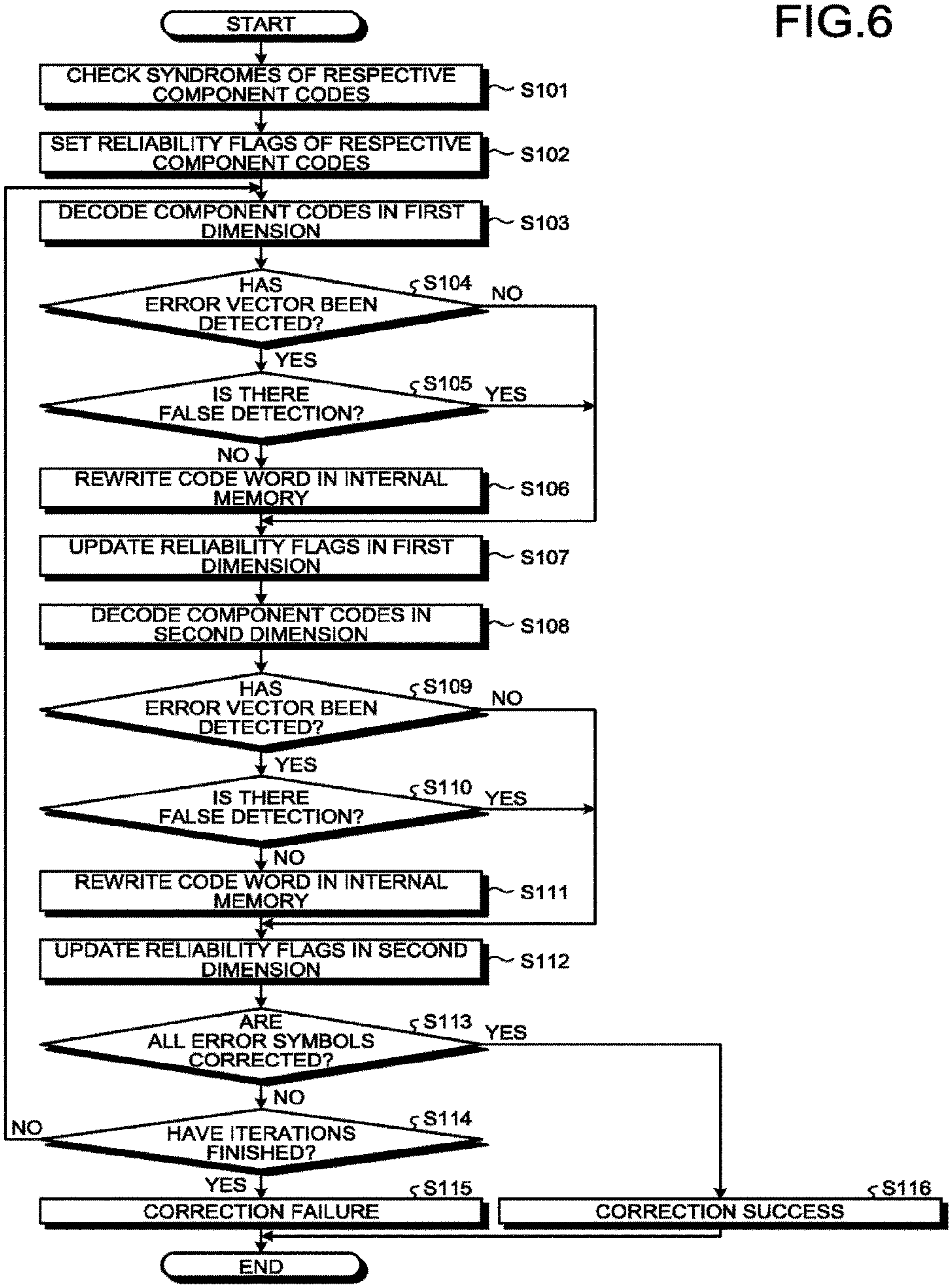
FIG. 6 is a flowchart illustrating a schematic operation example of the decoding process according to the first embodiment.

Subsequently, an overall operation flow of the decoding process according to the present embodiment is described in detail with reference to the drawings. FIG. 6 is a flowchart illustrating a schematic operation example of the decoding process according to the present embodiment. The present description focuses on the operation of the decoder 242. In the present description, for clarification, a case where a multi-dimensional error correction code to be decoded is the iterated code 30 illustrated in FIG. 3 is exemplified. Further, when performing the operation illustrated in FIG. 6, it is assumed that the iterated codes 30 read from the non-volatile memory 3 have been accumulated in the internal memory 245.

As illustrated in FIG. 6, the decoder 242 first performs a syndrome check with respect to the respective component codes 301 to 304 and 311 to 314 of the iterated code 30 accumulated in the internal memory 245 (Step S101), and sets (updates) reliability flags of the respective component codes (additional information) stored in the additional-information storage unit 243 (Step S102), based on a result of the syndrome check.

Subsequently, the decoder 242 performs a decoding process in a unit of component code with respect to the component codes 301 to 304 in a first dimension (assumed as the C1 direction) among the two dimensions (the C1 direction and the C2 direction) constituting the iterated code 30(Step S103). Specifically, as described above, the decoder 242 sequentially selects the component code to be decoded one after another from the component codes 301 to 304, and performs iterative decoding, while assuming that the maximum correction number is the maximum correctable number t (for example, 2) with respect to the selected component code.

The decoder 242 then determines whether an error vector has been detected in a decoding process at Step S103 (Step S104), and if an error vector has not been detected (NO at Step S104), the process proceeds to Step S107. On the other hand, if an error vector has been detected (YES at Step S104), the decoder 242 inputs the detected error vector to the detection unit 244 to determine whether detection of the error vector is false detection (Step S105).

The detection unit 244 to which the error vector has been input determines whether the detection of the error vector by the decoder 242 is false detection according to the first algorithm described above. Specifically, the detection unit 244 specifies a value of the reliability flag regarding the component code including an error indicated by the detected error vector, among the component codes 311 to 314 in a second dimension (the C2 direction), which is a different dimension from the first dimension (the C1 direction), by referring to the additional-information storage unit 243 to determine whether the detection of the error vector is false detection based on the specified value of the reliability flag. Further, the detection unit 244 returns the determination result to the decoder 242. If the determination result input from the detection unit 244 indicates that the detection is false detection (YES at Step S105), the decoder 242 proceeds to Step S107. On the other hand, if the determination result indicates that the detection is not false detection (NO at Step S105), the decoder 242 performs a rewriting process of rewriting a value of the symbol corresponding to the detected error vector in the iterated code 30 in the internal memory 245, that is, the symbol determined to be an error to a value estimated to be correct (Step S106), and the process proceeds to Step S107.

At Step S107, the decoder 242 calculates the syndromes of the respective component codes 301 to 304 from the iterated code 30 after the decoding process at Step S103 or the rewriting process at Step S106, and updates the reliability flags 401 to 404 for the component codes 301 to 304 in the first dimension registered in the additional-information storage unit 243 based on the calculated syndromes (Step S107). At this time, as described above, the decoder 242 can calculate the syndromes of the respective component codes 311 to 314 in the second dimension from the iterated code 30 after the rewriting process, and update the reliability flags 411 to 414 for the component codes 311 to 314 in the second dimension based on the calculated syndromes.

The decoder 242 performs operations identical to the operations described at Step S103 to Step S107 with respect to the component codes 311 to 314 in the other second dimension (the C2 direction) of the two dimensions constituting the iterated code 30. Specifically, the decoder 242 first performs the decoding process in a unit of component code with respect to the component codes 311 to 314 in the second dimension in the same manner as the operation described at Step S103 (Step S108). Subsequently, the decoder 242 determines whether an error vector has been detected in the decoding process at Step S108 (Step S109). If an error vector has not been detected (NO at Step S109), the decoder 242 proceeds to Step S112, and if an error vector has been detected (YES at Step S109), the decoder 242 inputs the detected error vector to the detection unit 244 to determine whether the detection of the error vector is false detection (Step S110). Subsequently, if an input determination result input from the detection unit 244 indicates that the detection of the error vector is false detection (YES at Step S110), the decoder 242 proceeds to Step S112. On the other hand, if the determination result indicates that the detection of the error vector is not false detection (NO at Step S110), the decoder 242 performs the rewriting process of rewriting a value of the symbol corresponding to the detected error vector in the internal memory 245 to a value estimated to be correct (Step S111), to proceed to Step S112. At Step S112, the reliability flags 411 to 414 for the component codes 311 to 314 in the second dimension registered in the additional-information storage unit 243 are updated based on the iterated code 30 after the decoding process at Step S108 or the rewriting process at Step S111.

Thereafter, the decoder 242 determines whether correction of all the error symbols in the iterated code 30 is successful (Step S113). If the correction is successful (YES at Step S113), the decoder 242 returns the correction success to the control unit 23 (Step S116), and stores user data in the internal memory 245 restored by the decoding process, for example, in the data buffer 25. It can be determined whether correction of all the error symbols has been successful, for example, based on whether the reliability flags with respect to all the component codes 301 to 304 and 311 to 314 constituting the iterated code 30 are "1", or whether the syndromes of all the component codes 301 to 304 and 311 to 314 become "0".

On the other hand, if correction of all the error symbols is not successful (NO at Step S113), the decoder 242 determines whether the end condition of the iterative decoding process with respect to the iterated code 30 loaded to the internal memory 245 is satisfied (Step S114). If the end condition is satisfied (YES at Step S114), the decoder 242 returns a decoding failure to the control unit (Step S115), and the operation is finished. On the other hand, if the end condition is not satisfied (NO at Step S114), the decoder 24 returns to Step S103 to perform the subsequent operations again with respect to the component codes 301 to 304 and 311 to 314 in the first and second dimensions. The end condition (cancellation condition) can be, for example, such that a sufficiently likely decoded word can be acquired, or the number of iterations of the iterative decoding has reached a preset predetermined number.

As described above, in the present embodiment, reliability flags are given to component codes constituting a multi-dimensional error correction code, as additional information indicating whether the reliability of the component codes (that is, a possibility of no error) is high or low. At the time of performing the iterative decoding with respect to the multi-dimensional error correction code, it is detected whether false detection has occurred in decoding with respect to the respective component codes by using the reliability flags, and when it is determined that false detection has occurred, error correction based on the false detection is avoided. Accordingly, occurrence of false detection can be suppressed, thereby enabling to suppress degradation of error correction performance.

Second Embodiment

In the first embodiment, a case where false detection generated due to decoding is detected to prevent occurrence of false correction has been exemplified. In a second embodiment exemplified below, even if false correction has occurred due to false detection that has not been detected as an error, occurrence of false correction is detected and handled appropriately, thereby suppressing degradation of error correction performance. In the following descriptions, constituent elements identical to those of the above embodiment are denoted by like reference signs and redundant explanations thereof will be omitted.

The configuration of the memory system according to the present embodiment can be identical to the configuration described in the first embodiment with reference to FIGS. 1 and 2. Further, it is assumed that as the multi-dimensional error correction code used as an example in the present embodiment, the iterated code 30 illustrated in FIG. 3 is used similarly to the first embodiment.

Figure 7:
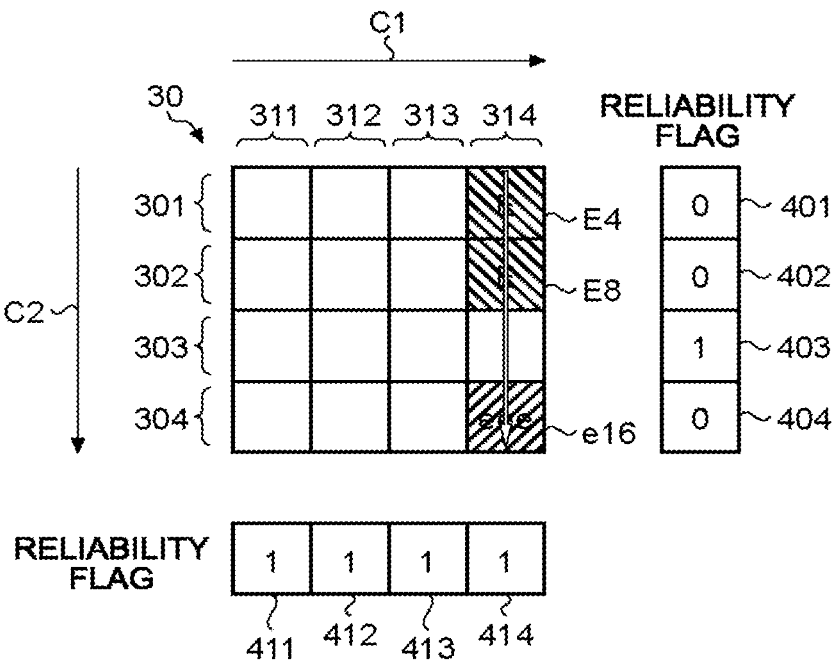
FIG. 7 is a schematic diagram illustrating an example of a flow of a decoding process with respect to component codes in a C2 direction according to a second embodiment.
Figure 8:
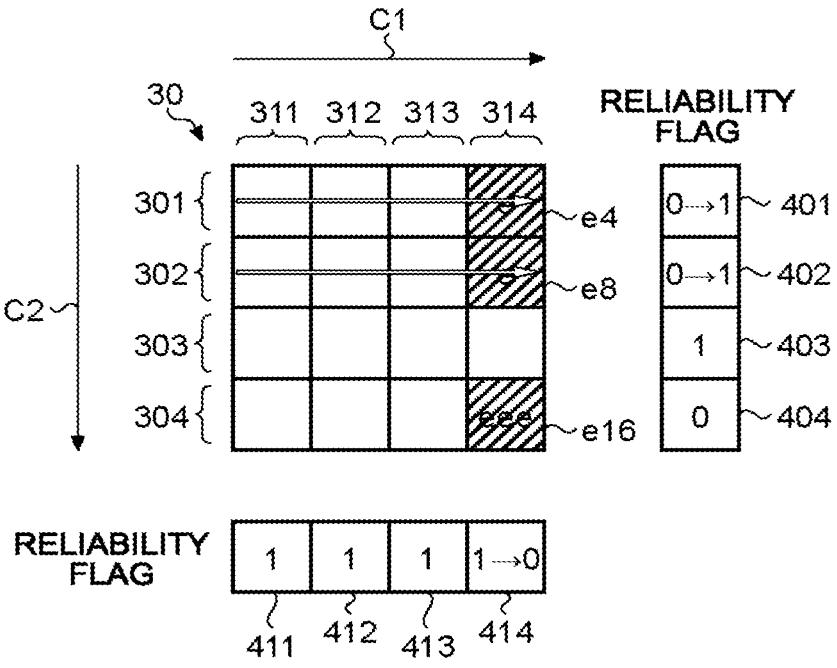
FIG. 8 is a schematic diagram illustrating an example of a flow of a decoding process with respect to component codes in a C1 direction according to the second embodiment.

Subsequently, a flow of the decoding process according to the present embodiment is described in detail with reference to the drawings. FIGS. 7 and 8 are schematic diagrams for explaining a flow of the decoding process according to the present embodiment, where FIG. 7 illustrates an example of the flow of the decoding process with respect to component codes in the C2 direction, and FIG. 8 illustrates an example of the flow of the decoding process with respect to component codes in the C1 direction to be performed after the decoding process illustrated in FIG. 7. Similarly to the first embodiment, it is assumed that the maximum correctable number t of the decoder 242 is 2 symbols. Further, descriptions of decoding with respect to the component codes 301 to 304 in the C1 direction performed first are omitted, and decoding with respect to the component codes 311 to 314 in the C2 direction is described here.

As illustrated in FIGS. 7 and 8, as additional information, the reliability flags 401 to 404 and 411 to 414 are set to the respective component codes 301 to 304 and 311 to 314 constituting the iterated code 30.

In the example illustrated in FIG. 7, as a result of decoding with respect to the component codes 311 to 314 in the C2 direction, errors E4, E8, and e16 have been detected in the parity symbols $p_0$, $p_1$, and $p_6$ of the component code 314. Among these errors, the errors E4 and E8 are false detection; however, it is assumed that these are not detected as false detection and error correction has been performed. Further, as a result of false correction with respect to the errors E4 and E8 as false detection, the syndrome calculated from the corrected component code 314 becomes "0". As a result, the reliability flag 414 of the component code 314 has been updated to "1".

Subsequently, it is assumed that the end condition (cancellation condition) of the iterative decoding process is not satisfied and decoding with respect to the component codes 301 to 304 has been performed again. As a result, as illustrated in FIG. 8, errors e4 and e8 are detected in the parity symbols $p_0$ and $p_1$ false-corrected by decoding in the C2 direction illustrated in FIG. 7.

In the case of such an example, as in the first embodiment, according to the method of determining whether the detection is false detection by confirming the reliability flag in the C2 direction that is a different dimension from the C1 direction, because the value of the reliability flag 414 of the component code 314 in the C2 direction indicates "1", detection of the error vector indicating the errors e4 and e8 is determined to be false detection. As a result, error correction with respect to the errors e4 and e8 is not performed. This indicates that the false correction already included in the iterated code 30 in the internal memory 245 cannot be detected and re-corrected.

Therefore, in the present embodiment, an algorithm (hereinafter, "second algorithm") for detecting false correction already included in the iterated code 30 in the internal memory 245 is employed in addition to, for example, the first algorithm for determining whether detection of the error vector is false detection employed in the first embodiment.

For the second algorithm, such an algorithm that "when an error vector detected with respect to one component code is "negated" by error vectors detected with respect to a plurality of component codes in another dimension, error correction based on the error vector detected with respect to the one component code is determined to be "false correction" can be employed. "An error vector in a certain dimension is "negated" by an error vector in another dimension" means that detection of the error vector in the certain dimension is determined to be false detection. Therefore, the second algorithm can be rephrased such that "when a rewriting process has been performed based on an error vector including a plurality of errors detected regarding a component code in a certain dimension and when the reliability flag of the component code in the certain dimension is "1", if the number of symbols to be written back to the original value before the rewriting process by decoding with respect to a component code in a dimension different from the certain dimension is equal to or larger than a predetermined number (for example, an integer of 2 or more), it is determined that the rewriting process is false correction, and if the number of symbols to be written back to the original value before the rewriting process is less than the predetermined number, it is determined that the rewriting process is not false correction".

More specifically, as the second algorithm, an algorithm such that "when an error vector has been detected regarding a component code in a certain dimension and when the reliability flag of the component code indicates "1", among the reliability flags of one or more component codes in another dimension respectively including an error included in the error vector, if the number of reliability flags indicating "0" is equal to or larger than a first predetermined number, it is determined that the detection of the error vector is not false detection, and if the number of reliability flags indicating "0" is less than the first predetermined number, it is determined that the detection of the error vector is false detection" can be employed.

Alternatively, as the second algorithm, such an algorithm that "when an error vector has been detected regarding a component code in a certain dimension and when the reliability flag of the component code indicates "1", a magnitude relation between the number obtained by adding 1 (that is the number of the reliability flag of the component code in the certain dimension) to the number of reliability flags indicating "1" and the number of reliability flags indicating "0", among the reliability flags of one or more component codes in another dimension respectively including an error included in the error vector, is specified (decision by majority), and if the number of reliability flags indicating "1" is the majority, it is determined that the detection of the error code is false detection, and if the number of the reliability flags indicating "1" and the number of the reliability flags indicating "0" is the came or the number of the reliability flags indicating "0" is the majority, it is determined that the detection of the error code is not false detection" can he employed.

However, the former second algorithm in the specific examples described above, if the first predetermined number is set to 1, even if "the number of reliability flags indicating "0" of the reliability flags of one or more component codes in the other dimension respectively including an error included in the error vector" is 1, it is determined that "the detection of the one or more error vectors is not false detection". Therefore, in the former second algorithm, the first predetermined number can be limited to 2 or more. Further, when the former second algorithm includes a case where the first predetermined number is 1, in addition to the former second algorithm, such an algorithm can be used that "when an error vector has been detected regarding a component code in a certain dimension, and the reliability flag of the component code indicates "1", if the number of reliability flags indicating "0" of the reliability flags of the one or more component codes in the other dimension respectively including an error included in the error vector" is 1, and the number of errors included in the detected error vector is the maximum correctable number, it is determined that the detection of the error vector is not false detection, and if the number of reliability flags indicating "0" of the reliability flags of the one or more component codes in the other dimension respectively including an error included in the error vector" is 0 or less than the maximum correctable number, it is determined that the detection of the error vector is false detection".

By employing the second algorithm described above, it can be precisely determined whether the error vector found by the decoding being currently performed (current decoding) is false-detected error vector or an error vector generated by being false-detected in the previous decoding (that is, not false detection in the current decoding) and handled, degradation of error correction performance can be further suppressed. According to the second algorithm, "detection of the error vector is false detection" has the same meaning as "a rewriting process performed in the previous decoding with respect to the component code to be decoded is not false correction", and "detection of the error vector is not false detection" has the same meaning as "a rewriting process performed in the previous decoding with respect to the component code to be decoded is false correction".

The second algorithm described above is applied to the example illustrated in FIG. 8. As a result, it is assumed that an error vector including errors e4 and e8 is erroneously detected by decoding with respect to the component code 314 in the C2 direction at a certain stage in the iterative decoding with respect to the C1 direction or the C direction. In this example, the reliability flags 401 and 402 of the component codes 301 and 302 in the C1 direction including the errors e4 and e8 are "0". Therefore, according to the first algorithm, the error vector including these errors e4 and e8 cannot be detected as the false correction, and as a result, the iterated code 30 in the internal memory 245 is rewritten based on the error vector.

Thereafter, when decoding of the component codes in the C2 direction is finished, decoding of the component codes in the C1 direction is performed again. At this time, it is assumed that an error vector including the error e4 is detected by decoding of the component code 301, and an error vector including the error e8 is detected by decoding of the component code 302. Because the reliability flag 414 of the component code 314 in the C2 direction including the errors e4 and e8 is "1", these error vectors are deemed as "false detection" according to the first algorithm. Therefore, in the present embodiment, based on the second algorithm described above, it is deemed that the error vector found by the decoding with respect to the component code 314 is "negated" by two error vectors of the component codes 301 and 302, and that the error vector found by the decoding with respect to the component code 314 is "false correction".

In this manner, in the examples illustrated in FIGS. 7 and 8, it is deemed that the error correction based on the error vector found with respect to the component codes 301 and 302 in the previous decoding with respect to the C1 direction is false correction based on the second algorithm. Therefore, the iterated code 30 in the internal memory 245 is rewritten based on the error vector found with respect to the component code 314 in the current decoding with respect to the C2 direction, and the reliability flags 401 and 402 are updated to "1" based on the syndromes calculated from the rewritten component codes 301 and 302. Further, regarding the component code 314 including the symbol deemed as false correction, the reliability flag 414 thereof is updated to "0". At this time, an false correction flag indicating whether the component code 314 has been false-detected in the past is separately provided as the additional information with respect to the component code 314, and the false correction flag can be updated to a value indicating that the component code 314 has been false-detected in the past. Details of the false correction flag are described in a fourth embodiment described later.

If information of values of the parity symbols $p_0$ and $p_1$ before rewrite due to false correction, or information indicating how the parity symbols $p_0$ and $p_1$ have been rewritten in the previous decoding is present, a rewriting process of rewriting the values of the parity symbols $p_0$ and $p_1$ (also as a rollback process, a returning process, or a re-rewriting process) can be performed based on the information.

Further, the algorithm for detecting false correction already included in the iterated code 30 in the internal memory 245 is not limited to a second algorithm described above, and can be variously modified. For example, various algorithms can be employed as the second algorithm, such as an algorithm in which the number of error-detected symbols regarding respective component codes is counted, and based on the count value, "regarding the component code having the number of error-detected symbols equal to or larger than a second predetermined number, it is determined that the error correction performed for the component code is false correction, and regarding the component code having the number of error-detected symbols less than the second predetermined number, it is determined that the error correction performed for the component code is not false correction".

An overall operation flow of the decoding process according to the present embodiment is described next in detail with reference to the drawings. In the following descriptions, as for operations identical to the operations described in the first embodiment with reference to FIG. 6, the descriptions in the first embodiment are cited here, and detailed explanations thereof will be omitted.

Figure 9:
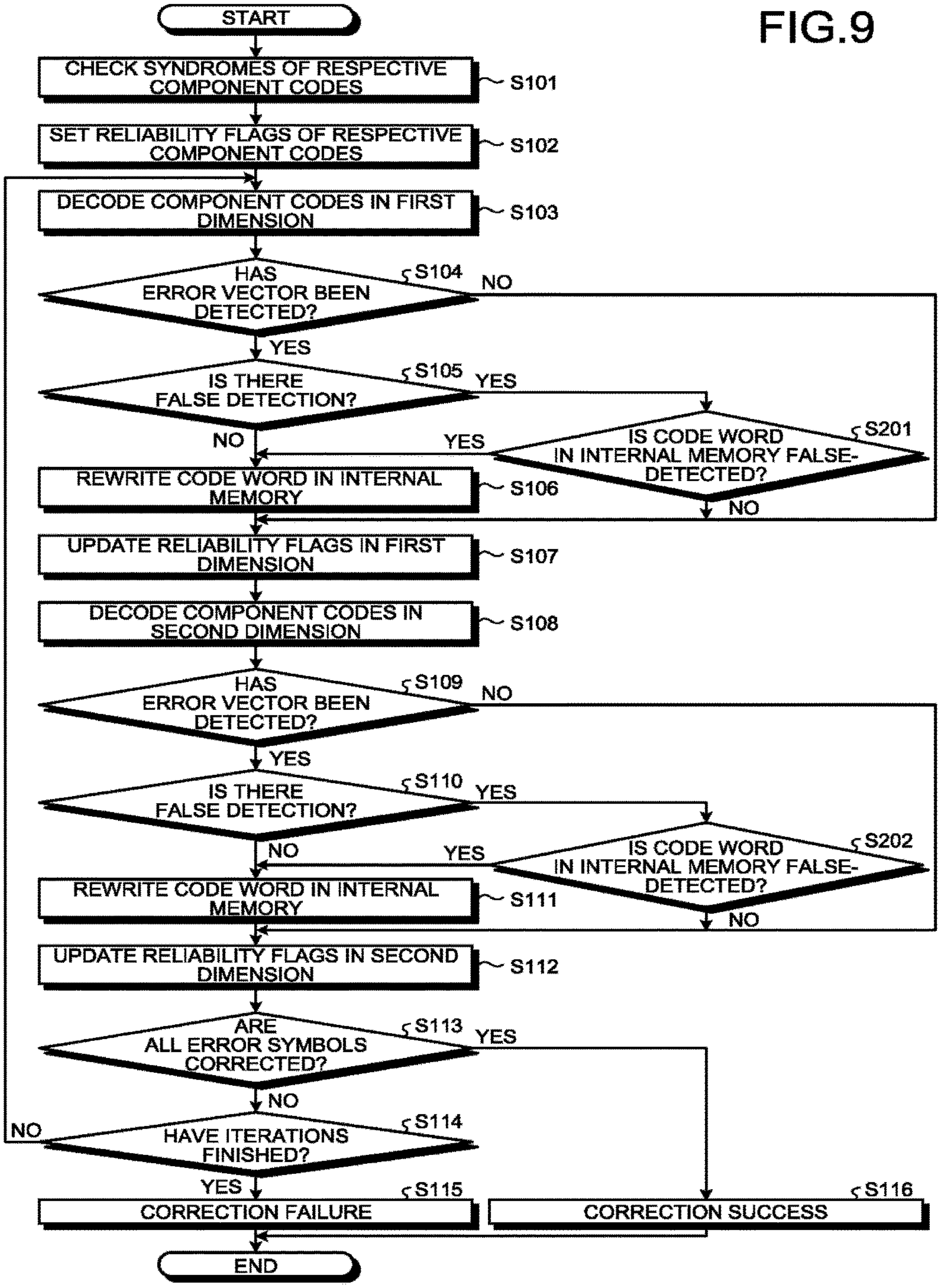
FIG. 9 is a flowchart illustrating a schematic operation example of the decoding process according to the second embodiment.

FIG. 9 is a flowchart illustrating a schematic operation example of the decoding process according to the present embodiment. The present description focuses on the operation of the decoder 242. In the present description, for clarification, a case where a multi-dimensional error correction code to be decoded is the iterated code 30 illustrated in FIG. 3 is exemplified. Further, when performing the operation illustrated in FIG. 9, it is assumed that the iterated codes 30 read from the non-volatile memory 3 have been accumulated in the internal memory 245.

As is clear from a comparison between the operation example illustrated in FIG. 9 and the operation example illustrated in FIG. 6, a main flow of the decoding process according to the present embodiment can be identical to the flow of the decoding process according to the first embodiment. However, in the present embodiment, at Step S105 in FIG. 9 (corresponding to Step S105 in FIG. 6), if the determination result input from the detection unit 244 indicates false detection (YES at Step S105), the decoder 242 determines whether an false-detected symbol is included in the code word (the iterated code 30) stored in the internal memory 245 (Step S201). Specifically, at Step S105, the detection unit 244, to which an error vector has been input at Step S105, determines whether the detected error vector is due to false correction that has been already included in the iterated code 30 in the internal memory 245 according to the second algorithm illustrated above, and returns a determination result to the decoder 242.

If the determination result input from the detection unit 244 indicates that the error vector is due to false correction (YES at Step S201), the decoder 242 proceeds to Step S105 to perform a rewriting process of rewriting the symbol corresponding to the detected error vector in the iterated code 30 in the internal memory 245, that is, a value of the symbol determined to be an error to a value estimated to be correct, that is, to the value before the error correction (false correction) (Step S106), to proceed to Step S107. On the other hand, if the determination result input from the detection unit 244 indicates that the error vector is not due to false correction, that is, detection of the error vector this time is false detection (NO at Step S201), the decoder 242 directly proceeds to Step S107.

Further, according to the present embodiment, at Step S110 in FIG. 9 (corresponding to Step S110 in FIG.6) similarly in the case where the determination result input from the detection unit 244 indicates that the error vector is false detection (YES at Step S110), the determination result whether the error vector is due to false correction determined by the detection unit 244 according to the second algorithm is input to the decoder 242, and the decoder 242 determines whether a false-detected symbol is included in the code word (the iterated code 30) stored in the internal memory 245 based on the determination result (Step S202). As a result of this determination, if the determination result input from the detection unit 244 indicates that the error vector is due to false correction (YES at Step S202), the decoder 242 proceeds to Step S111 to perform a rewriting process (Step S111), and then proceeds to Step S112. On the other hand, if the determination result input from the detection unit 244 indicates that the error vector is not due to false correction (YES at Step S110), that is, detection of the error vector this time is false detection (NO at Step S202), the decoder 242 directly proceeds to Step S112, and thereafter performs operations identical to the operations described with reference to Steps S112 to S116 in FIG. 6.

As described above, according to the present embodiment, false correction already incorporated in the multi-dimensional error correction code (the iterated code 30) in the internal memory 245 detected by using a reliability flag used as additional information, and if it is determined that false correction is detected, a rewriting process of resolving the false correction is performed. Due to this process, even if false correction occurs, the false correction can be resolved, thereby enabling to suppress degradation of error correction performance. Other configurations, operations, and effects of the present embodiment are identical to those described in the above embodiment, and thus detailed explanations thereof will be omitted.

Third Embodiment

In the second embodiment, a case where a reliability flag is used as information for detecting false correction already incorporated in the multi-dimensional error correction code (the iterated code 30) in the internal memory 245 is exemplified. Meanwhile, in a third embodiment, a method of accurately detecting false correction already incorporated in the multi-dimensional error correction code (the iterated code 30) in the internal memory 245 is described with reference to a specific example. In the following descriptions, constituent elements identical to those of the above embodiments are denoted by like reference signs and redundant explanations thereof will be omitted.

Similarly to the embodiment described above, the configuration of the memory system (semiconductor memory device) according to the present embodiment can be identical to the configuration described in the first embodiment with reference to FIGS. 1 and 2. Further, as the multi-dimensional error correction code to be used as an example in the present embodiment, similarly to the embodiment described above, the iterated code 30 illustrated in FIG. 3 in the first embodiment is used.

Figure 10:
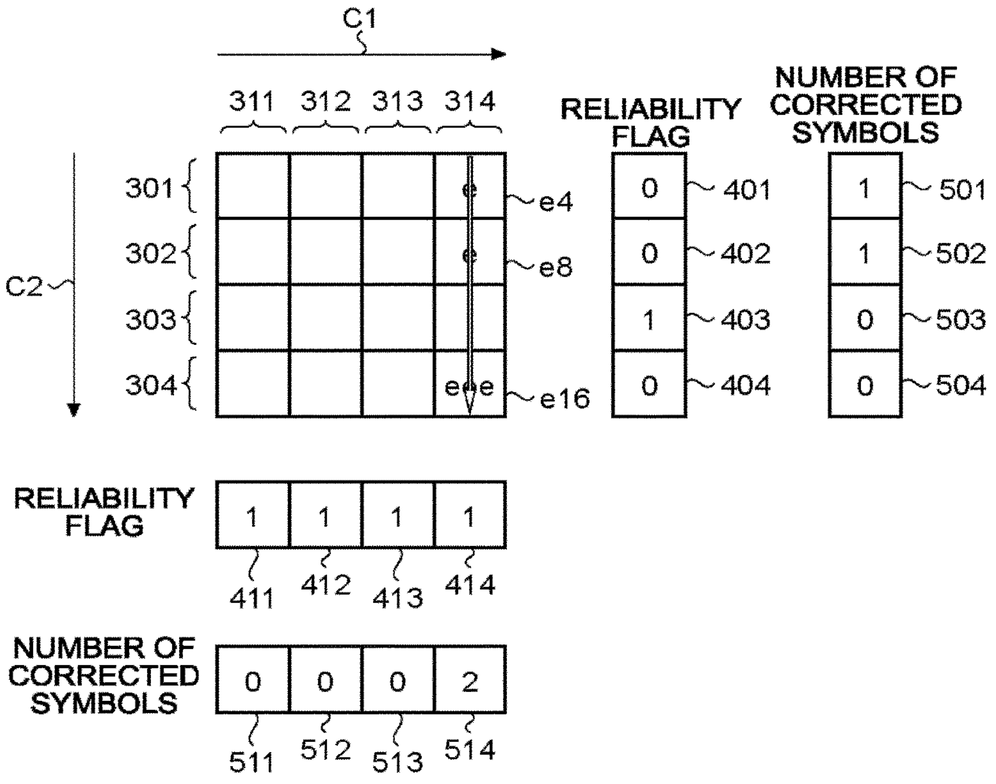
FIG. 10 is a schematic diagram illustrating an example of a flow of a decoding process with respect to component codes in the C2 direction according to a third embodiment.
Figure 11:
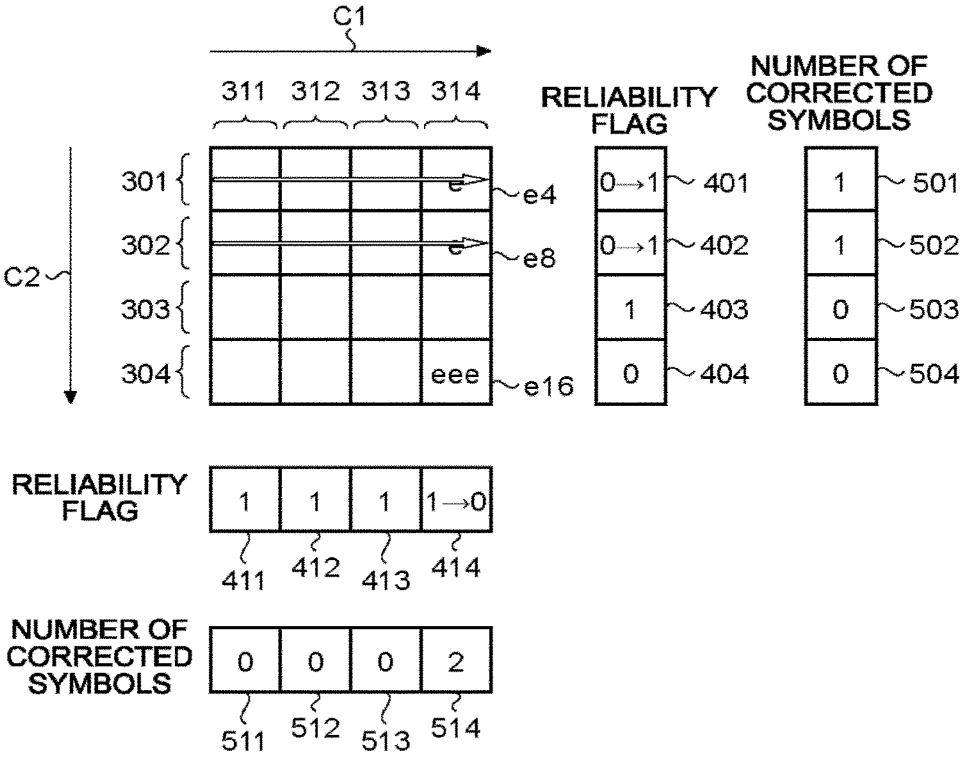
FIG. 11 is a schematic diagram illustrating an example of a flow of a decoding process with respect to component codes in the C1 direction according to the third embodiment.

Subsequently, a flow of the decoding process according to the present embodiment is described in detail with reference to the drawings. FIGS. 10 and 11 are schematic diagrams for explaining a flow of the decoding process according to the present embodiment, where FIG. 10 illustrates an example of the flow of the decoding process with respect to component codes in the C2 direction, and FIG. 11 illustrates an example of the flow of the decoding process with respect to component codes in the C1 direction to be performed after the decoding process illustrated in FIG. 10. Similarly to the first embodiment, it is assumed that the maximum correctable number t of the decoder 242 is 2 symbols. Further, descriptions of decoding with respect to the component code 301 to 304 in the C1 direction performed first are omitted, and decoding with respect to the component codes 311 to 314 in the C2 direction is described here.

As illustrated in FIGS. 10 and 11, the number of corrected symbols 501 to 504 and 511 to 514 are set in addition to the reliability flags 401 to 404 and 411 to 414 as additional information to the respective component codes 301 to 304 and 311 to 314 constituting the iterated code 30.

The number of corrected symbols means a cumulative number of symbols that have been rewritten by the rewriting process (error correction process) performed with respect to component codes corresponding to the respective symbols. The number of corrected symbols may include or may not include the number of symbols rewritten to the value at the time of read from the non-volatile memory 3, as a result of determination as false correction.

When the number of corrected symbols is used as the information for detecting false correction already incorporated in the multi-dimensional error correction code (the iterated code 30) in the internal memory 45, as the algorithm for detecting the already incorporated false correction, a third algorithm described below can be employed in addition to the second algorithm in the second embodiment. That is, as the third algorithm, such an algorithm that "regarding a component code rewritten based on the error vector determined later as false detection according to the second algorithm, if the number of errors included in the error vector is equal to or larger than a third predetermined number, the detection of the error vector is determined as false detection, and if the number of errors is less than the third predetermined number, the detection of the error vector is determined as not false detection" can be employed.

For the third predetermined number in the third algorithm, for example, the maximum correctable number t (=2) in decoding by the decoder 242 can be used. This is because, if error vectors equal to or larger than the maximum correctable number t are detected, there is a high possibility that the detection of the error vector is false detection. In this manner, there is a correlation between the number of corrected symbols of the respective component codes and occurrence of false correction. Therefore, by configuring the third algorithm such that, by setting the third predetermined number as the maximum correctable number t, if an error vector is detected again in the symbol rewritten by the error correction (the rewriting process) performed based on the detection of error vectors equal to or larger than the maximum correctable number t, it is determined that the previous error correction is false correction, more accurate detection of false correction can be performed. However, the third predetermined number is not limited to the maximum correctable number t, and can be set appropriately according to the code structure of the multi-dimensional error correction code.

Similarly to the second algorithm, the third algorithm is used, for example, at Steps S201 and S202 in FIG. 9, when the detection unit 244 input with the error vector determines whether the detected error vector is due to the false correction already included in the iterated code 30 in the internal memory 245. Other operations in the decoding process according to the present embodiment can be identical to the operations described in, for example, the second embodiment with reference to FIG. 9.

As described above, in the present embodiment, as the additional information that becomes information for determination for detecting false correction already included in the iterated code 30 in the internal memory 245, the number of corrected symbols indicating the number of symbols rewritten by the rewriting process (error correction process) having performed with respect to the respective component codes is used. As described above, because there is a correlation between the number of corrected symbols of the respective component codes and the false correction, by using the number of corrected symbols as the information for determination for detecting false correction, more accurate detection of false correction becomes possible. As a result, degradation of error correction performance can be further suppressed. Other configurations, operations, and effects of the present embodiment are identical to those described in the above embodiments, and thus detailed explanations thereof will be omitted.

Fourth Embodiment

The fourth embodiment is described next in detail with reference to the drawings. In the fourth embodiment, for example, if there is a component code in which false correction is detected in the second or third embodiment described above, by skipping the decoding process with respect to the component code in the subsequent iterative decoding process, it can be prevented that the same false correction occurs repeatedly (prevention of recurrence). In the following descriptions, constituent elements identical to those of the above embodiments are denoted by like reference signs and redundant explanations thereof will be omitted.

Similarly to the embodiments described above, the configuration of the memory system (semiconductor memory device) according to the present embodiment can be identical to the configuration described in the first embodiment with reference to FIGS. 1 and 2. Further, as the multi-dimensional error correction code to be used as an example, similarly to the embodiments described above, the iterated code 30 illustrated in FIG. 3 is used.

Figure 12:
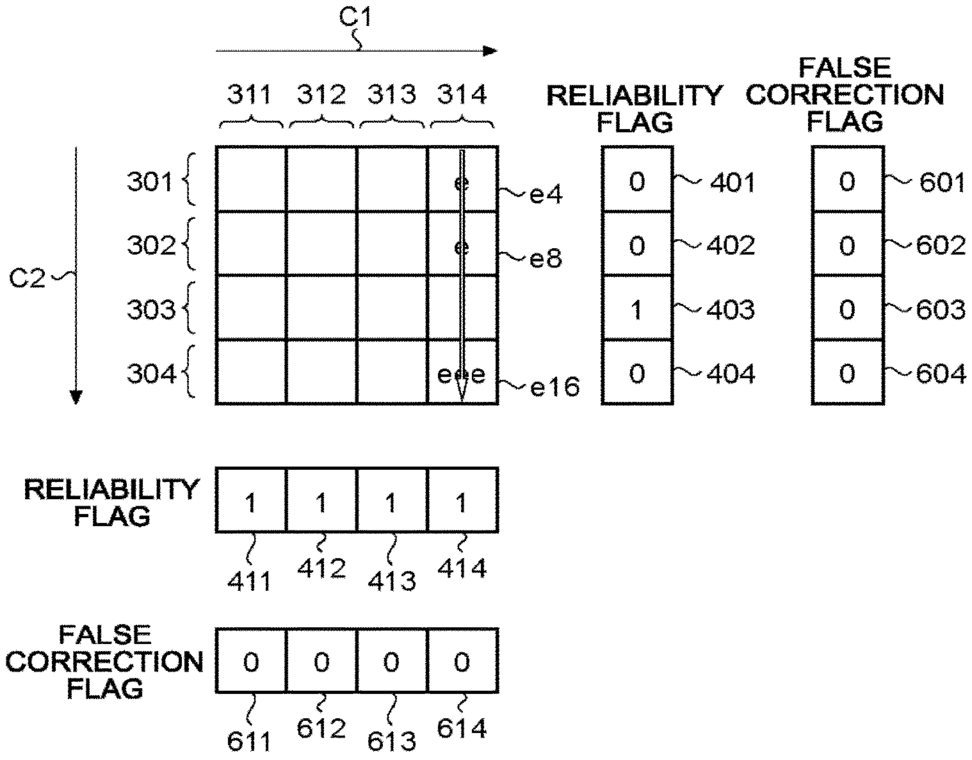
FIG. 12 is a schematic diagram illustrating an example of a flow of a decoding process with respect to component codes in the C2 direction according to a fourth embodiment.
Figure 13:
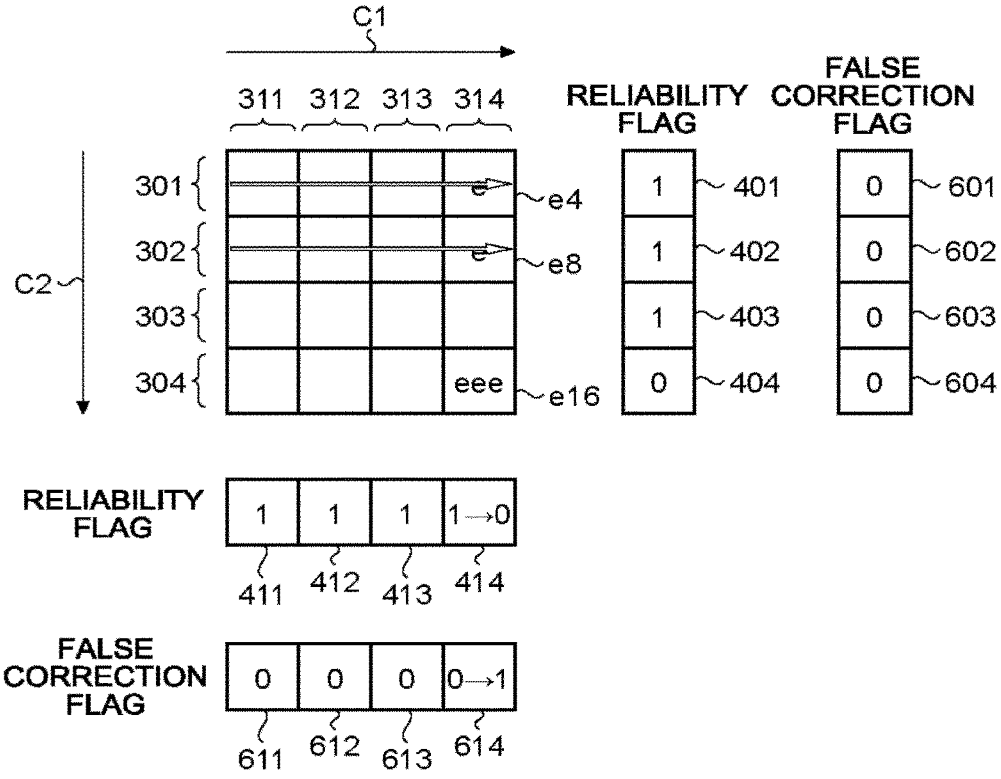
FIG. 13 is a schematic diagram illustrating an example of a flow of a decoding process with respect to component codes in the C1 direction according to the fourth embodiment.

Subsequently, a flow of the decoding process according to the present embodiment is described in detail with reference to the drawings. FIGS. 12 and 13 are schematic diagrams for explaining a flow of the decoding process according to the present embodiment, where FIG. 12 illustrates an example of the flow of the decoding process with respect to the component codes in the C2 direction, and FIG. 13 illustrates an example of the flow of the decoding process with respect to the component codes in the C1 direction to be performed after the decoding process illustrated in FIG. 12. Similarly to the second embodiment, it is assumed that the maximum correctable number t of the decoder 242 is 2 symbols. Further, descriptions of decoding with respect to the component codes 301 to 304 in the C1 direction performed first are omitted, and decoding with respect to the component codes 311 to 314 in the C2 direction is described.

As illustrated in FIGS. 12 and 13, as additional information, false correction flags 601 to 604 and 611 to 614 are set in addition to the reliability flags 401 to 404 and 411 to 414 to the respective component codes 301 to 304 and 311 to 314 constituting the iterated code 30.

The false correction flag is additional information indicating whether false correction has been performed in the past with respect to the component code respectively corresponding to the false correction flag, in other words, whether it has been determined that false correction had occurred in the previous decoding process with respect to the component codes respectively corresponding thereto. As the false correction flag, a binary flag indicating by "1" that the false correction has occurred in the previous decoding process and indicating by "0" that the false correction has not occurred can be used.

As an algorithm that prevents the recurrence of false correction by using such an false correction flag, for example, an algorithm that "skips the decoding process regarding the component code with the false correction flag being "1" (fourth algorithm) can be employed.

Subsequently, an overall operation flow of the decoding process according to the present embodiment is described in detail with reference to the drawings. In the following descriptions, as for operations identical to the operations described in the second embodiment with reference to FIG. 9, the descriptions in the second embodiment are cited here, and detailed explanations thereof will be omitted.

The overall operation flow of the decoding process according to the present embodiment can be identical to the operation flow described in the embodiments described above with reference to FIG. 6 or FIG. 9. However, in the present embodiment, the decoding operations illustrated at Step S103 and S108 in FIG. 6 or FIG. 9 are operations illustrated in FIG. 14.

Figure 14:
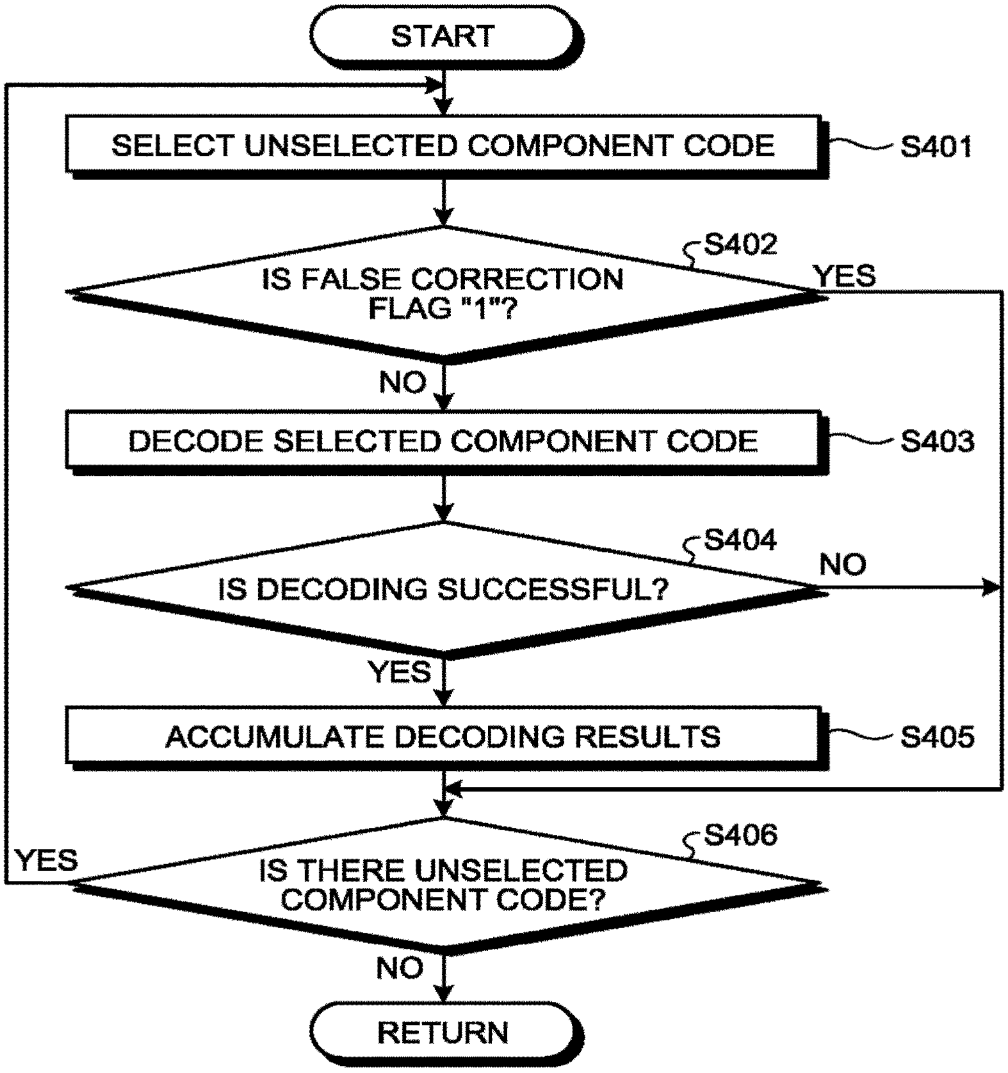
FIG. 14 is a flowchart illustrating an example of the decoding process according to the fourth embodiment.

As illustrated in FIG. 14, in the present embodiment, at the time of performing the decoding process in a unit of component code with respect to the component codes in the first dimension (the C1 direction) or the second dimension (the C2 direction), unselected component codes are sequentially selected (Step S401). As the decoding order, as described above, various orders can be applied, such as a method of selecting a component code to be decoded along the C2/C1 directions in order from the component codes 301/311 as the first row.

Subsequently, the decoder 242 determines whether false correction has been performed in the past with respect to the selected component code by using the detection unit 244 (Step S402). Specifically, the decoder 242 inputs information for identifying the component code being selected to the detection unit 244. In response thereto, the detection unit 244 determines whether false correction has been performed in the past with respect to the selected component code by referring to the false correction flag given to the component code being selected, and returns a determination result to the decoder 242.

If false correction has been performed in the past with respect to the selected component code (YES at Step S402), the decoder 242 skips the decoding process with respect to the component code being selected and proceeds to Step S406. On the other hand, if false correction has not performed in the past with respect to the selected component code (NO at Step S402), the decoder 242 performs iterative decoding with respect to the selected component code (Step S403). Subsequently, if the decoding is successful (YES at S404), the decoder 242 accumulates the decoding results in a predetermined memory (for example, a part of the internal memory 245) (Step S405), to proceed to Step S406. On the other hand, if the decoding is not successful (NO at Step S404), the decoder 242 proceeds to Step S406 without storing the decoding result.

At Step S406, the decoder 242 determines whether there is an unselected component code in a target dimension (the first dimension (the C1 direction) or the second dimension (the C2 direction)), and if there is an unselected component code (YES at Step S406), the decoder 242 returns to Step S401 to select the next component code and performs the subsequent operations. On the other hand, if all the component codes have been selected (NO at Step S406), the decoder 242 returns to the operation in FIG. 6 or FIG. 9.

The false correction flag according to the present embodiment can be reset in the process of iterative decoding. That is, such a configuration is possible that if the number of iterations of the decoding process has reached a predetermined number in the process of performing the operations illustrated in FIG. 6 or FIG. 9 and FIG. 14, the false correction flag can be reset to continue the decoding process thereafter. The predetermined number for determining availability of reset of the false correction flag can be set to an arbitrary number, for example, the number of iterations capable of expecting that the possibility of performing the same false correction becomes low to some extent.

As described above, in the present embodiment, regarding the component code in which false correction has occurred once, the decoding process with respect to the component code is skipped in the subsequent iterative decoding process. Accordingly, in the present embodiment, it can be prevented that the same false correction occurs repeatedly (prevention of recurrence), and thus degradation of error correction performance can be further suppressed. Other configurations, operations, and effects of the present embodiment are identical to those described in the above embodiments, and thus detailed explanations thereof will be omitted.

Fifth Embodiment

A fifth embodiment is described next in detail with reference to the drawings. In the fifth embodiment, for example, decoding is performed again with respect to the component code in which decoding is not successful in the embodiments described above, by using a method referred to as "list decoding" in order to improve error correction performance. In the following descriptions, constituent elements identical to those of the above embodiments are denoted by like reference signs and redundant explanations thereof will be omitted.

The configuration of the memory system (semiconductor memory device) according to the present embodiment can be identical to the configuration described in the first embodiment with reference to FIGS. 1 and 2. Further, it is assumed that, as the multi-dimensional error correction code used as an example in the present embodiment, the iterated de 30 illustrated in FIG. 3 is used similarly to the embodiments described above.

The list decoding is a decoding method in which a plurality of patterns of code words with one or more symbol values being inverted (flipped) are generated from one reception word, and a decoding process is performed to the respective code words in the generated patterns, and as a result, if there is a component code being successful in decoding, a decoded word estimated to be the likeliest is found from decoded words acquired by the successful decoding. Therefore, in the present embodiment, as one of the methods of estimating the likely decoded word in the hard-decision decoding using the list decoding, the first embodiment or the second embodiment described above is used.

As to which symbol value in a reception word is inverted is managed by, for example, a hypothesis referred to as "test pattern". The test pattern is a hypothesis regarding an error position in the reception word, and is information for specifying positions of one or more symbols to be inverted in the reception word. For example, in a test pattern presuming that a top symbol in the reception word is an error symbol, information for specifying the top symbol is included. Similarly, for example, in a test pattern presuming that the top symbol and the second symbol in the reception word are error symbols, information for specifying the top symbol and the second symbol is included.

Therefore, in the list decoding, test patterns of the same number as the number of patterns at the position of presumed error symbol are used. However, if the number of the presumed error symbols is too large, the number of test patterns to be used becomes enormous numbers. Therefore, it is desired that the number of presumed error symbols is appropriately set according to, for example, the code structure of the reception word or error tendency.

The decoding process employing the list decoding according to the present embodiment is performed instead of Step S115 in the operation of the decoding process described with reference to FIG. 6 or FIG. 9 in the embodiments described above. Therefore, in the present description, based on the decoding process illustrated in FIG. 9, the decoding process employing the list decoding to be performed instead of Step S115 in the operation illustrated in FIG. 9 is described by example.

Figure 15:
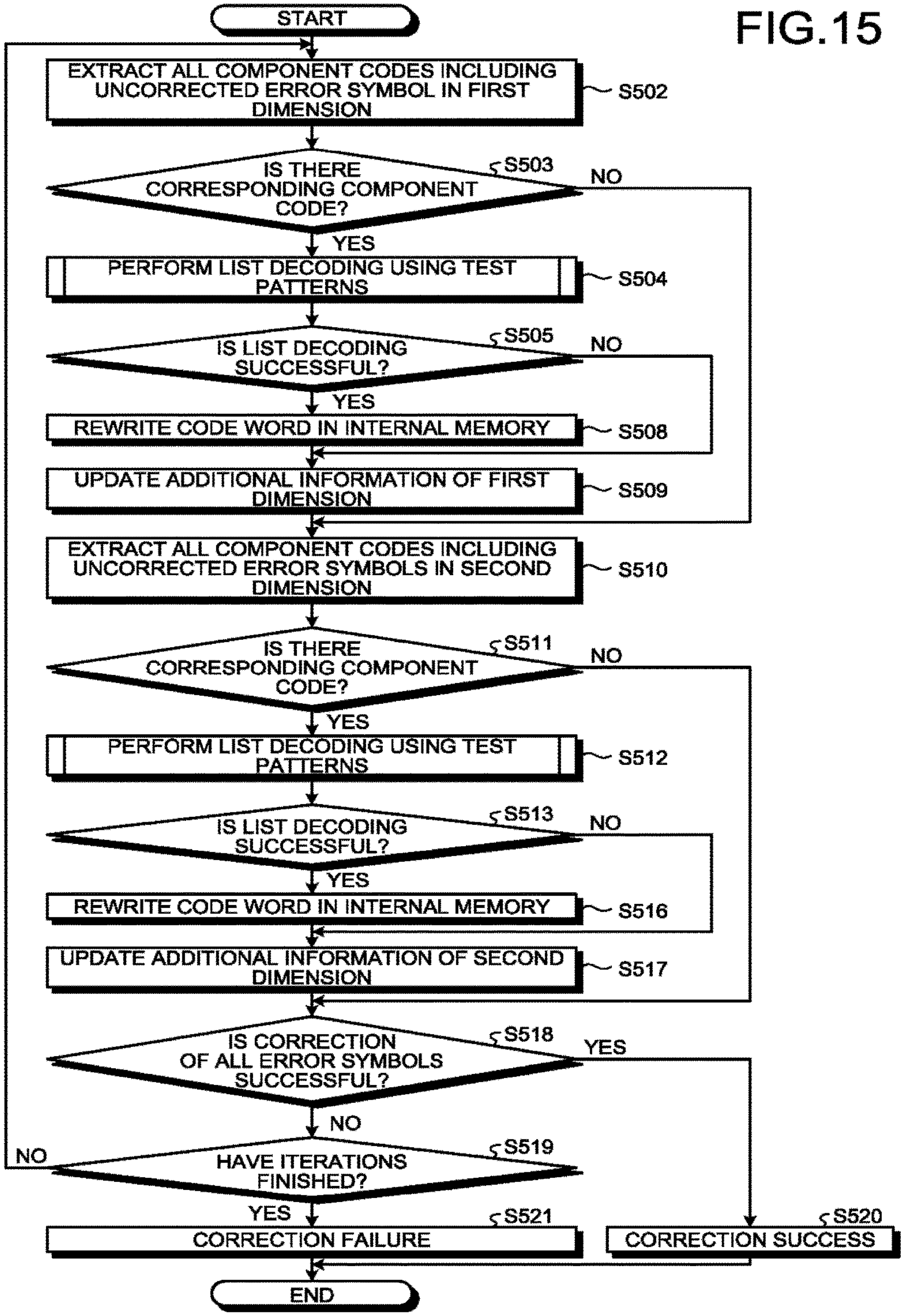
FIG. 15 is a flowchart illustrating a schematic operation example of a decoding process employing list decoding according to a fifth embodiment.

FIG. 15 is a flowchart illustrating a schematic operation example of a decoding process employing the list decoding according to the present embodiment. As illustrated in FIG. 15, for example, at Step S113 in FIG. 9, if it is determined that correction of all the error symbols in the iterated code 30 is not successful (NO at Step S113), and that the end condition of the iterative decoding process with respect to the iterated code 30 loaded into the internal memory 245 is satisfied (YES at Step S114), the decoder 242 first extracts all the component codes with the reliability flag not being "1", that is, all the component codes including uncorrected error symbols from, for example, the component codes 301 to 304 in the first dimension (the C1 direction) in the iterated code 30 loaded into the internal memory 245 (Step S502). Subsequently, the decoder 242 determines whether a component code including an uncorrected error symbol has been extracted at Step S502 (Step S503), and if such a component code has not been extracted (NO at Step S503), the decoder 242 proceeds to Step S510. On the other hand, if a component code including an uncorrected error symbol has been extracted (YES at Step S503), the decoder 242 performs list decoding using the test pattern with respect to the extracted component code (Step S504). An operation example of list decoding using the test pattern is described later with reference to FIG. 16.

The decoder 242 then determines whether the list decoding at Step S504 is successful (Step S505). If the list decoding is not successful (NO at Step S505), the decoder 242 proceeds to Step S509. On the other hand, if the list decoding is successful (YES at Step S505), in the iterated code 30 in the internal memory 245, the decoder 242 performs a rewriting process in which a value of the symbol indicated as an error by a detected error vector and a value of the symbol corresponding to the error symbol presumed in the test pattern used at the time of generating the likely decoded word in the list decoding at Step S504 to values estimated to be correct (Step S508), and proceeds to Step S509.

At Step S509, the decoder 242 calculates the syndromes of the respective component codes 301 to 304 from the iterated code 30 after the list decoding at Step S504 or the rewriting process at Step S508, and updates the reliability flags 401 to 404 for the component codes 301 to 304 in the first dimension registered in the additional-information storage unit 243 based on the calculated syndromes. At this time, as described above, the decoder 242 can calculate the syndromes of the respective component codes 311 to 314 in the second dimension from the iterated code 30 after the rewriting process, and update the reliability flags 411 to 414 for the component codes 311 to 314 in the second dimension.

Subsequently, the decoder 242 performs operations identical to the operations described at Step S502 to Step S509 with respect to the component codes 311 to 314 in the second dimension (the C2 direction) (Steps S510 to 517 in FIG. 15), to rewrite the iterated code 30 in the internal memory 245 according to need, and updates the reliability flags 411 to 414 for the component codes 311 to 314 in the second dimension based on the syndromes of the respective component codes calculated from the iterated code 30 after the rewriting process.

Thereafter, the decoder 242 performs operations identical to the operations described at Step S113 to Step S114 in FIG. 9 (Step S518 to S519 in FIG. 15), to determine whether correction of all the error symbols in the iterated code 30 is successful (Step S519). If correction is successful (YES at Step S518), the decoder 242 returns correction success to the control unit (Step S520), and stores user data in the internal memory 245 restored by the decoding process, for example, in the data buffer 25. On the other hand, if correction of all the error symbols is not successful (NO at Step S518), the decoder 242 determines whether the end condition of the iterative decoding process is satisfied (Step S519). If the end condition is satisfied (YES at Step S519), the decoder 242 returns a decoding failure to the control unit 23 (Step S521), and the operation is finished. On the other hand, if the end condition is not satisfied (NO at Step S519), the decoder 242 returns to Step S502, to perform the subsequent operations with respect to the component codes 301 to 314 and 311 to 314 in the first and second dimensions again.

Figure 16:
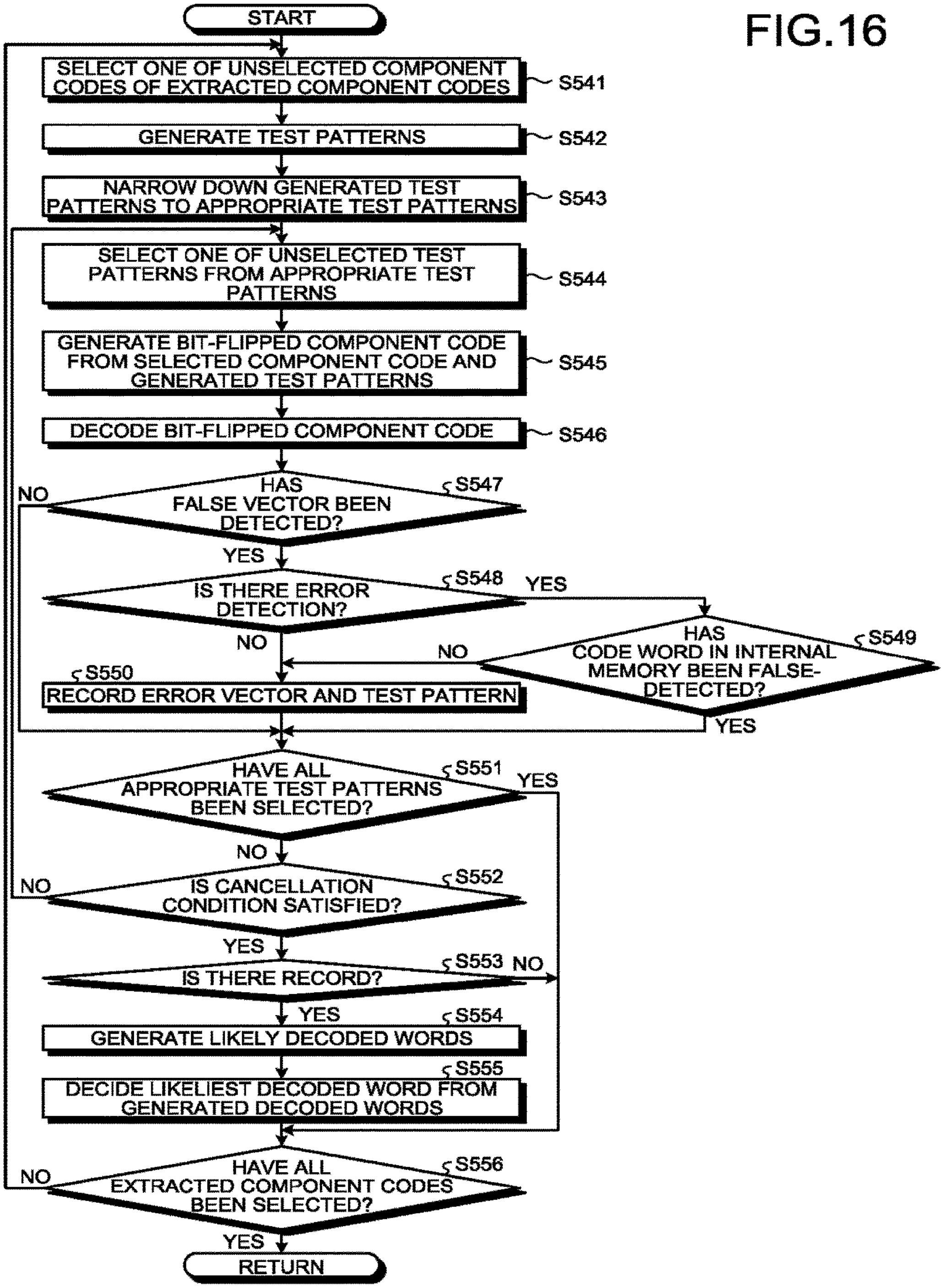
FIG. 16 is a flowchart illustrating an operation example of a decoding process using a test pattern executed at Steps S504 and S512 in FIG. 15.

An operation example of the list decoding using the test pattern at Steps S504 and S512 in FIG. 15 is described next in detail with reference to FIG. 16. FIG. 16 is a flowchart illustrating a schematic operation example of the list decoding using the test pattern in the present embodiment.

As illustrated in FIG. 16, in the operation example, the decoder 242 first selects one of unselected component codes of the component codes including an uncorrected error symbol in the first dimension and the second dimension extracted at Step S502 and S510 in FIG. 15 (Step S541). Subsequently, the decoder 242 generates a plurality of test patterns with respect to the selected component code (Step S542). The plurality of test patterns are test patterns in which position patterns of the presumed error symbols are different from each other.

Subsequently, the decoder 242 performs narrowing for extracting an appropriate test pattern from the generated test patterns (Step S543). The appropriate to pattern can be a test pattern in which a symbol that cannot be an error is not presumed to be an error symbol, or a test pattern in which the excessive number symbols are not presumed to be error symbols. In the narrowing from the generated test patterns to an appropriate test pattern, additional information such as the reliability flag stored in, for example, the additional-information storage unit 243 can be used. Specifically, for example, regarding a certain test pattern, if the reliability flag with respect to a component code in another dimension including a symbol presumed to be an error symbol in the test pattern is "1", a method of deeming that the test pattern is not an appropriate test pattern can be employed.

The decoder 242 then selects one of the unselected test patterns of the test patterns narrowed down at Step S543 (Step S544). Subsequently, the decoder 242 inverts a value of the symbol corresponding to the position of the symbol presumed to be an error in the test pattern selected at Step S543, among the symbols in the component code selected at Step S541, to generate a bit-flipped component code (Step S545).

Subsequently, the decoder 242 performs iterative decoding with respect to the bit-flipped component code as at Step S103 in FIG. 6 (Step S546). The decoder 242 then determines whether an error vector has been detected in the decoding process at Step S546 (Step S547). If an error vector has not been detected (NO at Step S547), the decoder 242 proceeds to Step S551. ON the other hand, if an error vector has been detected (YES at Step S547), the decoder 242 inputs the detected error vector to the detection unit 244 by the same operation as the operation described at, for example, Step S105 in FIG. 6, to determine whether detection of the error vector is false detection (Step S548).

As a result of determination at Step S548, if a determination result input from the detection unit 244 indicates that the detection of the error vector is not false detection (NO at Step S548), the decoder 242 records the detected error vector and the test pattern used at the time of detecting the error vector once in the internal memory 24.5 or the like (Step S550), to proceed to Step S551.

On the other hand, if the determination result input from the detection unit 244 indicates that the detection of the error vector is false detection (YES at Step S546), the decoder 242 determines whether an false-detected symbol is included in the code word (the iterated code 30) stored in the internal memory 245 by the same operation as the operation, for example, described at Step S201 in FIG. 9 (Step S549). However, in the present embodiment, one or more symbols in the component code to be decoded have been virtually error-corrected by the hypothesis by means of the test pattern. Therefore, the number of corrected symbols regarding the component code to be decoded has a value obtained by adding the number of error symbols presumed in the respective test patterns to the original number that does not take the test pattern into consideration. For example, if the original number of corrected symbols is "1", and the number of error symbols presumed in the test pattern is "1", the number of corrected symbols referred to by the detection unit 244 at Step S547 becomes "2" as a total of these values.

The decoder 242 then proceeds to Step S551, if the determination result input from the detection unit 244 indicates that the error vector is due to false correction (YES at Step S549). Or the other hand, if the determination result input from the detection unit 244 indicates that the error vector is not due to false correction (110 at Step S549), the decoder 242 proceeds to Step S550 to record the detected error vector and the e pattern used at the time of detecting the error vector once in the internal memory 245 or the like, to proceed to Step S551.

At Step S551, the decoder 242 determines whether there is an unselected test pattern of the test patterns narrowed down at Step S543, that is, whether the decoding process has been performed by being combined with all the appropriate test patterns. If all the test patterns have been selected (YES at Step S551), the decoder 242 proceeds to Step S556. On the other hand, if there is an unselected test pattern (NO at Step S551), the decoder 242 determines whether the end condition (cancellation condition) of the decoding process is satisfied (Step S552). If the end condition is satisfied (YES at Step S552), the decoder 242 proceeds to Step S553. On the other hand, if the end condition is not satisfied (NO at Step S552), the decoder 242 returns to Step S544, selects the next unselected test pattern, and performs the subsequent operations. The end condition (cancellation condition) can be, for example, such that the number of repetitions of the decoding has reached a predetermined number of iterations, or a sufficiently likely decoded word can be acquired.

At Step S553, the decoder 242 determines whether one or more sets of error vector and test pattern have been recorded at Step S550. If one or more sets of error vector and test pattern have been recorded (YES at Step S553, the decoder 242 XORs the error vector with the test pattern recorded in combination, to generate likely decoded words (Step S554). Subsequently, the decoder 242 decides the likeliest decoded word among the generated likely decoded words (Step S555), to proceed to Step S556. On the other hand, if the error vector and the test pattern have not been recorded (NO at Step S553), the decoder 242 directly proceeds to Step S556.

In the decision of the, likeliest decoded word at. Step S555, the operations described with reference to FIG. 6 in the first embodiment can be performed. That is, the likely decoded words generated at Step S554 can be incorporated in the internal memory 245, perform the operations illustrated in FIG. 6 with respect to the iterated code 30 acquired thereby, and specify which decoded word is the likeliest decoded word based on the result of decoding success/failure, the reliability flag, or the syndrome value acquired as a result of performing the operations. Further, such a configuration is also possible that the operations described with reference to FIG. 9 in the second embodiment are performed at the time of deciding the likeliest decoded word at Step S555.

At Step S556, the decoder 242 determines whether all the component codes extracted at Steps S502/510 in FIG. 15 have been selected, that is, the decoding process has been performed with respect to the component codes extracted at Steps S502/510 by using all the test patterns narrowed down at Step S543. If there is an unselected component code (NO at Step S556), the decoder 242 returns to Step S541 to select the next unselected component code, and performs the subsequent operations. On the other hand, if all the extracted component codes have been selected (YES at Step S556), the decoder 242 returns to the operation illustrated in FIG. 15.

As described above, according the present embodiment, for example, by combining list decoding to the decoding in the embodiments described above, it is possible to improve error correction performance. Other configurations, operations, and effects of the present embodiment are identical to those described in the above embodiments, and thus detailed explanations thereof will be omitted.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A decoding device that decodes a multi-dimensional error correction code having two or more component codes, comprising:

a storage unit that stores therein the multi-dimensional error correction code;

an additional-information storage unit that manages each syndrome of the at least two component codes or a reliability flag indicating whether the syndrome has a value of 0 or other than 0;

a decoder that performs a first decoding process in a unit of component code with respect to the multi-dimensional error correction code red in the storage unit to detect an error vector of each component code; and a detection unit that determines whether detection of the error vector by the decoder is false detection, based on the syndrome or the reliability flag stored in the additional-information storage unit.

2. The decoding device according to claim 1, wherein the decoder performs, when it is determined by the detection unit that detection of the error vector is not false detection, a first rewriting process of rewriting a symbol corresponding to the error vector in the multi-dimensional error correction code in the storage unit, and updates the syndrome or the reliability flag in the additional-information storage unit based on the multi-dimensional error correction code after the first rewriting process, and when it is determined by the detection unit that detection of the error vector is false detection, does not perform the first rewriting process.

3. The decoding device according to claim 2, wherein when the first rewriting process is performed based on an error vector including a plurality of errors detected regarding a first component code in a first dimension and when a first syndrome or a first reliability flag managed in the additional-information storage unit regarding the first component code indicates that the first syndrome is 0, the detection unit determines that the firs rewriting process is false correction when number of symbols to be rewritten to a value before the first rewriting process by decoding with respect to a component code in n second dimension different from the first dimension is two or more, and determines that the first rewriting process is not false correction when the number of symbols to be rewritten to the value before the first rewriting process is less than two, and when the detection unit determines that the first rewriting process is false correction, the decoder performs a second rewriting process of rewriting a symbol corresponding to the error vector in the multi-dimensional error correction code in the storage unit, and updates the syndrome or the reliability flag in the additional-information storage unit based on the multi-dimensional error correction code after the second rewriting process, and when the detection unit determines that the first rewriting process is not false correction, the decoder does not perform the second rewriting process.

4. The decoding device according to claim 2, wherein the additional-information storage unit manages number of corrected symbols indicating number of error-corrected symbols regarding the component codes constituting the multi-dimensional error correction code stored in the storage unit, the detection unit determines whether the first rewriting process performed previously by the decoder with respect to the symbol in the storage unit corresponding to the error vector detected by the first decoding process is false correction, based on the number of corrected symbols stored in the additional-information storage unit, and when the detection unit determines that the first rewriting process performed previously with respect to the symbol in the storage unit corresponding to the error vector is false correction, the decoder performs a second rewriting process of rewriting the symbol corresponding to the error vector in the multi-dimensional error correction code in the storage unit, and updates the syndrome or the reliability flag in the additional-information storage unit based on the multi-dimensional error correction code after the second rewriting process, and when the detection unit determines that the first rewriting process performed previously with respect to the symbol in the storage unit corresponding to the error vector is not false correction, the decoder does not perform the second rewriting process.

5. The decoding device according to claim wherein the additional-information storage unit manages a false correction flag indicating whether false correction has been performed in past regarding the component codes constituting the multi-dimensional error correction code stored in the storage unit, and the decoder skips the first decoding process with respect to the component code indicating that the false correction flag in the additional-information storage unit indicates that false correction has been performed in the past.

6. The decoding device according to claim 1, wherein when an error vector has been detected regarding a first component code in a first dimension, the detection unit determines that detection of the error vector is false detection when the syndrome or the reliability flag managed in the additional-information storage unit regarding a second component code including an error indicated by the error vector, the second component code being in a second dimension different from the first dimension, indicates that the syndrome is 0, and determines that detection of the error vector is not false detection when the syndrome or the reliability flag managed in the additional-information storage unit regarding the second component code indicates that the syndrome has a value other than 0.

7. The decoding device according to claim 1, wherein the decoder generates a test pattern in which one or more symbols in a component code to be decoded is presumed to be an error symbol, generates a bit-flipped component code by inverting a value of a symbol presumed to be an error symbol in the generated test pattern, among symbols constituting the component code to be decoded, and performs a second decoding process with respect to the bit-flipped component code.

8. The decoding device according to claim 1, wherein the decoder generates the test patterns of a plurality of patterns in which symbols at a combination position different from each other are presumed to be error symbols, narrows down a test pattern to be used in the second decoding process, among the generated test patterns of the plurality of patterns, based on the syndrome or the reliability flag managed in the additional-information storage unit, and generates the bit-flipped component code by inverting the value of the symbol presumed to be the error symbol in the component code to be decoded by using the narrowed down test pattern.

9. The decoding device according to claim 7, wherein the decoder generates test patterns of a plurality of patterns in which symbols at a combination position different from each other are presumed to be error symbols, respectively performs the second decoding process with respect to a plurality of bit-flipped component codes generated respectively by using the test patterns of the plurality of patterns, specifies a test pattern that can acquire a likely decoded word, from the test patterns of the plurality of patterns based on a result of the second decoding process with respect to the bit-flipped component codes, generates likely decoded words by XORing the specified test pattern with the component code to be decoded, performs the first decoding process with respect to the generated likely decoded words, and decides a likeliest decoded word of the generated likely decoded words based on a result of the first decoding process.

10. The decoding device according to claim 7, wherein when an error vector has been detected by the second decoding process with respect to a first component code in a first dimension bit-flipped by using a test pattern, the detection unit determine: that detection of the error vector is false detection and a hypothesis of the test pattern is wrong when there is a syndrome or a reliability flag managed in the additional-information storage unit regarding a second component code including an error indicated by the error vector, the second component code being in a second dimension different front the first dimension, which indicates that the syndrome is 0, and determines that detection of the error vector is not false detection and there is a high possibility that the hypothesis of the first test pattern is correct when the reliability flag or the syndrome indicating that the syndrome is 0 is not included, and the decoder specifies one of the error vectors determined by the detection unit that detection of the error vector is not false detection and there is a high possibility that the hypothesis of the first test pattern is correct as a likely error vector when a plurality of error vectors have been detected by the second decoding process with respect to a bit-flipped first component codes in the first dimension generated respectively by using test patterns of a plurality of patterns, and performs a first rewriting process of rewriting the likely error vector and the symbol corresponding to the test pattern in the multi-dimensional error correction code in the storage unit, and updates the syndrome or the reliability flag in the additional-information storage unit based on the multi-dimensional error correction code after the first rewriting process.

11. The decoding device according to claim 7, wherein the additional-information storage unit manages number of corrected symbols indicating number of error-detected symbols regarding the component codes constituting the multi-dimensional error correction code stored in the storage unit, the detection unit determines whether a first rewriting process performed previously by the decoder with respect to the symbol in the storage unit corresponding to the error vector detected by the second decoding process is false correction, based on a number obtained by adding number of error symbols presumed in the test pattern to the number of corrected symbols stored in the additional-information storage unit, and when the detection unit determines that the first rewriting process performed previously with respect to the symbol in the storage unit corresponding to the error vector is false correction, the decoder performs a second rewriting process of rewriting the symbol corresponding to the error vector in the multi-dimensional error correction code in the storage unit, and updates the syndrome or the reliability flag in the additional-information storage unit based on the multi-dimensional error correction code after the second rewriting process, and when the detection unit determines that the first rewriting process performed previously with respect to the symbol in the storage unit corresponding to the error vector is not false correction, the decoder does not perform the second rewriting process.

12. The decoding device according to claim 1, wherein the decoder sets or updates the respective syndromes or the respective reliability flags in the additional-information storage unit based on a syndrome calculated from respective component codes constituting the multi-dimensional error correction code stored in the storage unit.

13. The decoding device according to claim 1, wherein the first decoding process is iterative decoding.

14. The decoding device according to claim 1, wherein at least one of the component odes constituting the multi-dimensional error correction code is any of a BCH (Bose-Chandhuri-Hocquenghem) code or an RS (Reed-Solomon) code.

15. The decoding device according to claim 1, wherein the reliability flag holds whether the syndrome has a value of 0 or other than 0 as a value of 1 or 0.

16. A decoding method of decoding a multi-dimensional error correction code having two or more component codes, comprising:

managing each syndrome of the at least two component codes or a reliability flag indicating whether the syndrome has a value of 0 or other than 0;

detecting an error vector in the respective component codes by performing a first decoding process in a unit of component code with respect to the multi-dimensional error correction code, and determining whether detection of the error vector with respect to the respective component codes is false detection, based on the syndrome or the reliability flag managed for each of the component codes.

17. The decoding method according to claim 16, further comprising:

when it is determined that detection of the error vector is not false detection, performing a first rewriting process of rewriting a symbol corresponding to the error vector in the multi-dimensional error correction code, and updating the syndrome or the reliability flag based on the multi-dimensional error correction code after the first rewriting process; and when it is determined that detection of the error vector is false detection, skipping the first rewriting process.

18. The decoding method according to claim 17, further comprising:

when the first rewriting process is performed based on an error vector including a plurality of errors detected regarding a first component code in a first dimension and when a first syndrome or a first reliability flag managed regarding the first component code indicates that the first syndrome is 0, determining that the first rewriting process is false correction when number of symbols to be rewritten to a value before the first rewriting process by decoding with respect to a component code in a second dimension different from the first dimension is two or more, and determining that the first rewriting process is not false correction when the number of symbols to be rewritten to the value before the first rewriting process is less than two; and when the first rewriting process is determined as false correction, performing a second rewriting process of rewriting a symbol corresponding to the error vector in the multi-dimensional error correction code, and updating the syndrome or the reliability flag based on the multi-dimensional error correction code after the second rewriting process; and when the first rewriting process is not determined as false correction, skipping the second rewriting process.

19. The decoding method according to claim 17, further comprising:

managing number of corrected symbols indicating number of error-corrected symbols regarding the component codes constituting the multi-dimensional error correction code;

determining, based on the number of corrected symbols managed for each of the component codes, whether the first rewriting process performed previously with respect to the symbol corresponding to the error vector detected by the first decoding process is false correction;

when the first rewriting process performed previously with respect to the symbol corresponding to the error vector is determined as false correction, performing a second rewriting process of rewriting the symbol corresponding to the error vector in the multi-dimensional error correction code, and updating the syndrome or the reliability flag based on the multi-dimensional error correction code after the second rewriting process; and when the first rewriting process performed previously with respect to the symbol corresponding to the error vector is not determined as false correction, skipping the second rewriting process.

20. The decoding method according to claim 16, further comprising:

when an error vector has been detected regarding a first component code in a first dimension, determining that detection of the error vector is false detection when the syndrome or the reliability flag managed regarding a second component code including an error indicated by the error vector, the second component code being in a second dimension different from the first dimension, indicates that the syndrome is 0, and determining that detection of the error vector is not false detection when the syndrome or the reliability flag managed regarding the second component code indicates that the syndrome has a value other than 0.

* * * * *